(12) United States Patent
Yamazaki et al.

(10) Patent No.: US 10,228,729 B2
(45) Date of Patent: Mar. 12, 2019

(54) ELECTRONIC DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Yasuhiko Takemura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/124,910

(22) PCT Filed: Mar. 4, 2015

(86) PCT No.: PCT/IB2015/051565
§ 371 (c)(1),
(2) Date: Sep. 9, 2016

(87) PCT Pub. No.: WO2015/136411
PCT Pub. Date: Sep. 17, 2015

(65) Prior Publication Data
US 2017/0023979 A1 Jan. 26, 2017

(30) Foreign Application Priority Data
Mar. 12, 2014 (JP) .................. 2014-048380

(51) Int. Cl.
*G06F 1/16* (2006.01)
*G06F 1/18* (2006.01)
(Continued)

(52) U.S. Cl.
CPC .......... *G06F 1/1652* (2013.01); *G06F 1/181* (2013.01); *H01L 27/3267* (2013.01);
(Continued)

(58) Field of Classification Search
CPC combination set(s) only.
See application file for complete search history.

(56) References Cited

U.S. PATENT DOCUMENTS 5,162,828 A 11/1992 Furness et al.
7,220,181 B2 5/2007 Okada
(Continued)

FOREIGN PATENT DOCUMENTS

CN 001397984 A 2/2003
CN 001971357 A 5/2007
(Continued)

OTHER PUBLICATIONS

International Search Report (Application No. PCT/IB2015/051565) dated Jun. 16, 2015.
(Continued)

*Primary Examiner* — Lisa Lea-Edmonds
(74) *Attorney, Agent, or Firm* — Nixon Peabody LLP; Jeffrey L. Costellia

(57) ABSTRACT

An electronic device includes a flexible display substrate including a transmission-type display region and a non-transmission-type display region, and the flexible display substrate is fixed on one or more of housings. Portion of the housing is transparent, and the transmission-type display region overlaps with this transparent portion. In addition, the non-transmission-type display region overlaps with opaque components such as an arithmetic processing unit, a battery, or the like stored in the housing. Display contents and display modes are used properly for the transmission-type display region and the non-transmission-type display region, thereby making it possible to display various images. Other embodiments are also claimed.

9 Claims, 23 Drawing Sheets

(51) Int. Cl.
  *H01L 27/32* (2006.01)
  *H01L 51/00* (2006.01)
  *H01L 51/52* (2006.01)

(52) U.S. Cl.
  CPC ...... *H01L 51/0097* (2013.01); *H01L 51/5237* (2013.01); *H01L 2251/5323* (2013.01); *H01L 2251/5338* (2013.01); *Y02E 10/549* (2013.01)

(56) References Cited

U.S. PATENT DOCUMENTS

| | | | |
|---|---|---|---|
| 7,250,930 B2 | 7/2007 | Hoffman et al. | |
| 7,301,171 B2 | 11/2007 | Osame et al. | |
| 7,327,335 B2 | 2/2008 | Yamazaki et al. | |
| 7,557,877 B2 | 7/2009 | Lee et al. | |
| 7,667,962 B2* | 2/2010 | Mullen | G06F 1/1624 359/461 |
| 7,737,444 B2 | 6/2010 | Osame et al. | |
| 8,009,145 B2 | 8/2011 | Yamazaki et al. | |
| 8,330,670 B2 | 12/2012 | Yamazaki et al. | |
| 8,367,440 B2 | 2/2013 | Takayama et al. | |
| 8,415,208 B2 | 4/2013 | Takayama et al. | |
| 8,760,375 B2 | 6/2014 | Yamazaki et al. | |
| 9,202,987 B2 | 12/2015 | Takayama et al. | |
| 9,337,244 B2 | 5/2016 | Hatano et al. | |
| 9,401,498 B2 | 7/2016 | Tanaka et al. | |
| 9,406,898 B2 | 8/2016 | Yamazaki et al. | |
| 9,425,220 B2 | 8/2016 | Miyake et al. | |
| 9,430,180 B2* | 8/2016 | Hirakata | G06F 3/1446 |
| 9,449,996 B2 | 9/2016 | Yamazaki et al. | |
| 9,721,998 B2 | 8/2017 | Yamazaki | |
| 2003/0032210 A1* | 2/2003 | Takayama | H01L 21/76251 438/30 |
| 2007/0121035 A1 | 5/2007 | Lee et al. | |
| 2010/0164973 A1* | 7/2010 | Huitema | G06F 1/1615 345/581 |
| 2010/0277443 A1* | 11/2010 | Yamazaki | G06F 1/1616 345/204 |
| 2013/0113843 A1 | 5/2013 | Yamazaki | |
| 2013/0314346 A1* | 11/2013 | Yamazaki | G06F 1/1616 345/173 |
| 2014/0211399 A1* | 7/2014 | O'Brien | G06F 1/1624 361/679.26 |
| 2014/0226275 A1* | 8/2014 | Ko | G06F 1/1626 361/679.27 |
| 2014/0292618 A1 | 10/2014 | Yamazaki et al. | |
| 2015/0261259 A1* | 9/2015 | Endo | G06F 1/1652 361/679.06 |
| 2016/0079283 A1 | 3/2016 | Takayama et al. | |

FOREIGN PATENT DOCUMENTS

| | | |
|---|---|---|
| EP | 1791019 A | 5/2007 |
| JP | 63-254419 A | 10/1988 |
| JP | 2002-221913 A | 8/2002 |
| JP | 2003-174153 A | 6/2003 |
| JP | 2004-317700 A | 11/2004 |
| JP | 2007-148347 A | 6/2007 |
| JP | 2012-190794 A | 10/2012 |
| JP | 2013-109056 A | 6/2013 |
| KR | 2003-0007208 A | 1/2003 |
| KR | 2007-0055211 A | 5/2007 |
| TW | 564471 | 12/2003 |

OTHER PUBLICATIONS

Written Opinion (Application No. PCT/IB2015/051565) dated Jun. 16, 2015.

* cited by examiner

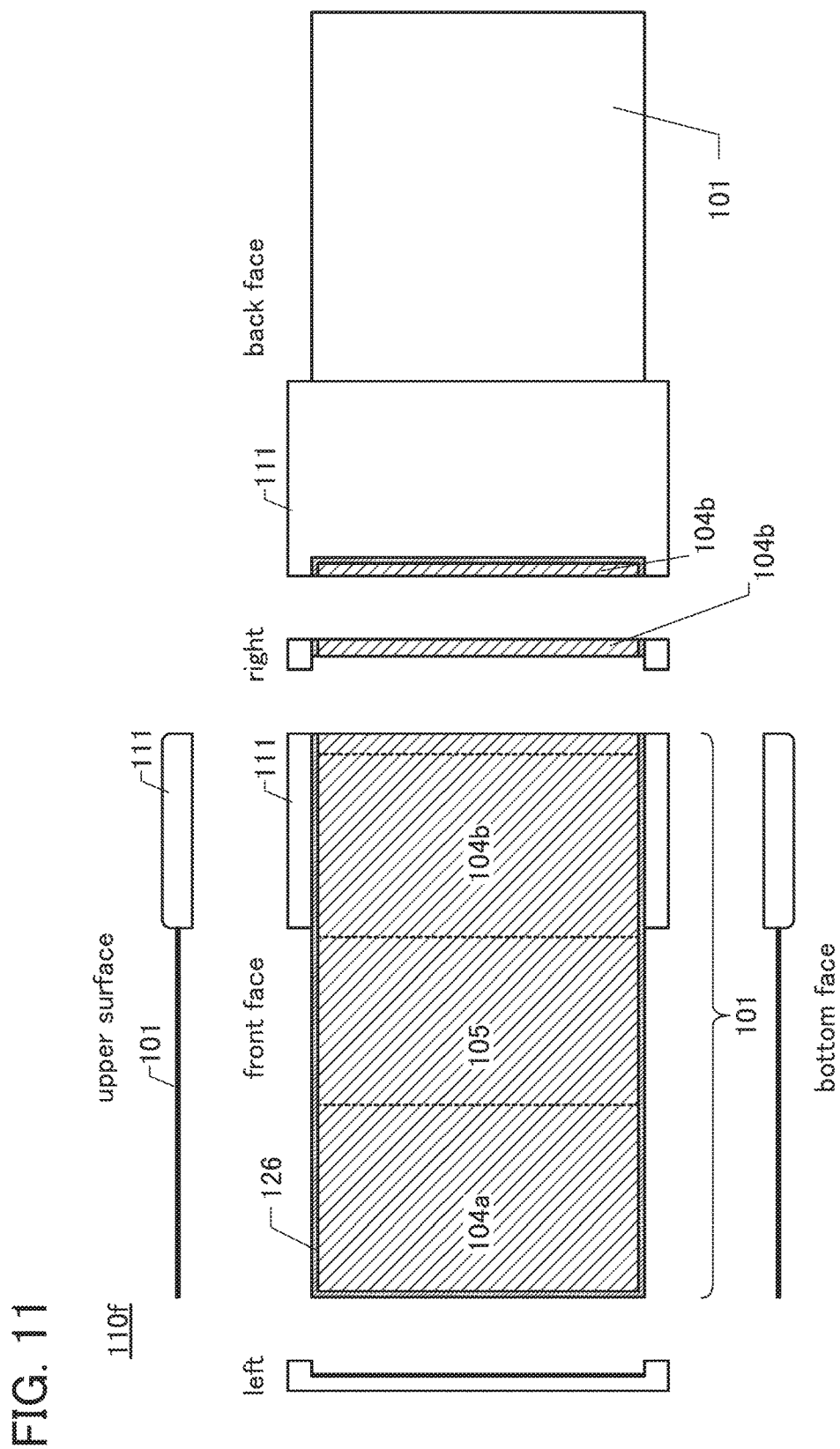

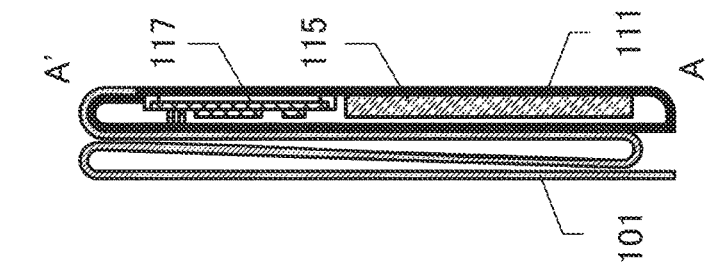

ELECTRONIC DEVICE

TECHNICAL FIELD

One embodiment relates to an electronic device.

BACKGROUND ART

Portable electronic devices (information processing devices) are under active development.

PRIOR ART DOCUMENT

Patent Document

[Patent Document 1] Japanese Published Patent Application No. 2012-190794

SUMMARY OF THE INVENTION

Problems to be Solved by the Invention

A novel display device, an electronic device or an information processing device including a novel display device, or things relating thereto are provided.

Means for Solving the Problems

An electronic device includes a flexible display substrate including a first display region and a second display region, an arithmetic processing unit, and a housing, and is characterized in that the first display region is a transmission-type display region, the second display region is a non-transmission-type display region, the arithmetic processing unit has a function of supplying an image signal to the flexible display substrate, and the arithmetic processing unit is stored in the housing.

EFFECT OF THE INVENTION

A novel display device, an electronic device including a display device, or things relating thereto can be provided.

BRIEF DESCRIPTION OF THE DRAWINGS

FIG. 11 A view illustrating an example of an electronic device.
FIG. 12 Views illustrating an example of an electronic device.

MODE FOR CARRYING OUT THE INVENTION

Figure 1A:
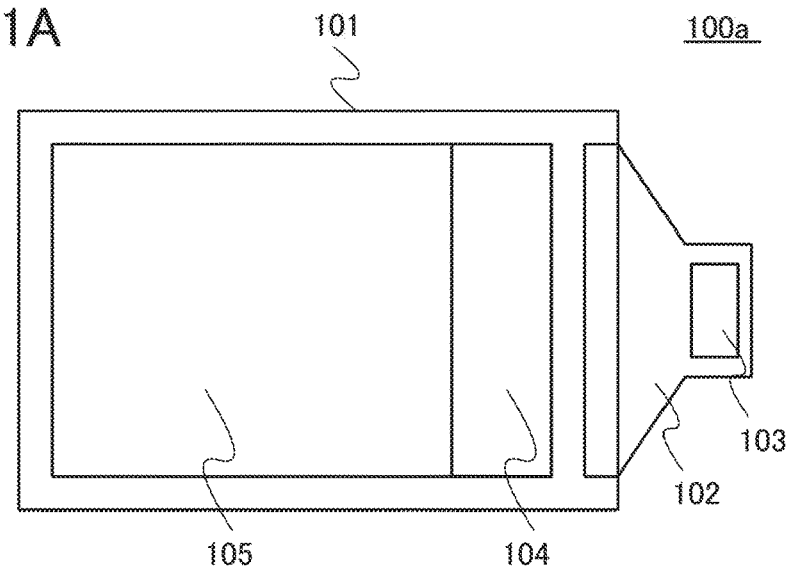
FIG. 1 Views illustrating an example of an electronic device.

Hereinafter, embodiments will be described in detail with reference to the drawings. However, it is easily understood by those skilled in the art that modes and details thereof can be modified in various ways without being limited to the description below. Furthermore, it is not construed as being limited to the description of the embodiments below. Note that reference numerals denoting similar components are commonly used in different drawings. Note that when similar parts are denoted, the same hatched pattern is used and reference numerals are not especially given in some cases.

Note that the ordinal numbers such as first and second are used for convenience and do not denote the order of steps and the stacking order of layers, and do not denote particular names.

(Embodiment 1)

The disclosed electronic device (including a display device) includes a flexible display substrate including a transmission-type display region and a non-transmission-type display region, and the flexible display substrate is fixed on one or a plurality of housings. Portion of the housing is transparent, and the transmission-type display region is designed to overlap with this transparent portion. In addition, the non-transmission-type display region is designed to overlap with opaque components such as an arithmetic processing unit or a battery stored in the housing, and designed so that the background of the above first display region can be visually confirmed when the flexible display substrate performs display. Display contents and display modes are used properly for the transmission-type display region and the non-transmission-type display region, thereby making it possible to display various images. Note that the transmission-type display region and the non-transmission-type display region each have such a spread that it can be confirmed with naked eyes when the display device is visually confirmed.

Figure 1B:
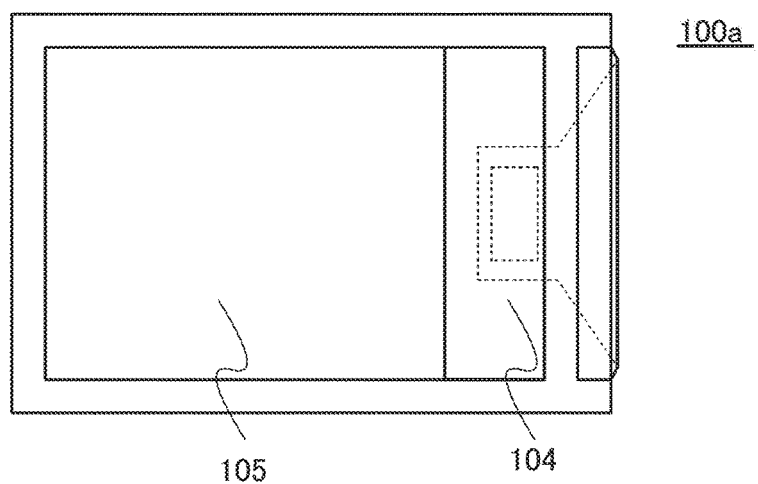
Figure 1C:
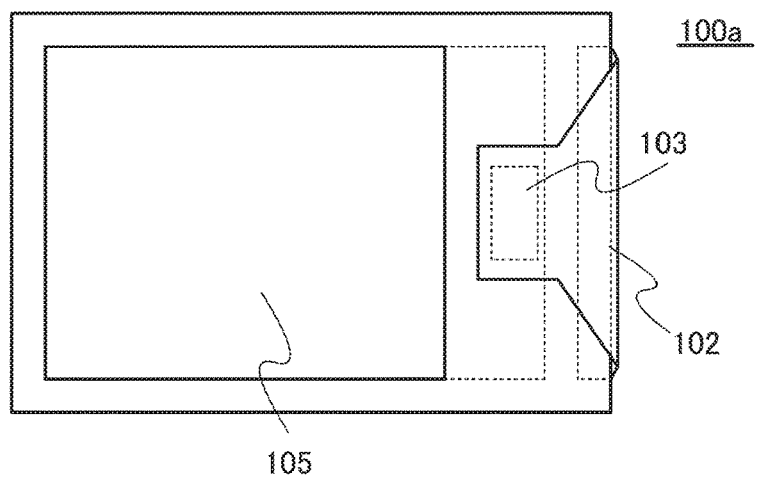

An example of a display device is illustrated in FIG. 1(A) to FIG. 1(C). A display device 100a includes a flexible display substrate 101, a flexible printed circuit 102 (FPC) connected thereto, and an IC chip 103 connected to the flexible printed circuit 102. The IC chip 103 has a function of supplying an image signal to the display device 100a. In addition, the flexible display substrate 101 is provided with a non-transmission-type display region 104 and a transmission-type display region 105. Note that boundaries of the non-transmission-type display region 104 and the transmission-type display region 105 are in contact with each other in one example.

Note that non-transmission-type display is a display mode by which a view (a background) behind the display device is completely invisible at the time of displaying. For example, the display by which the view behind the display device is visible while not performing display and is almost invisible while performing display is included. As an example of the non-transmission-type display, a bottom-emission display mode, a top-emission display mode, or the like of an organic electroluminescence display device can be given. Transmission-type display is a display mode by which a clear image or blurred image of a view behind the display device is visible temporarily or permanently. For example, the display by which the view behind the display device is almost invisible while performing display and is visible while not performing display is included. As an example of the transmission-type display, a transflective (see-through) display method of an organic electroluminescence display device can be given.

In FIG. 1(A), a state in which the flexible printed circuit 102 is unfolded is illustrated. In FIG. 1(B) and FIG. 1(C), states in which the flexible printed circuit 102 is folded are illustrated. FIG. 1(B) illustrates a state in which the IC chip 103 is on the back of the flexible display substrate 101. FIG. 1(C) illustrates a state in which the IC chip 103 is in the foreground (that is, a state in which FIG. 1(B) is turned upside down). Although an opaque object such as the IC chip 103 is indispensable for operation of the display device 100a, the display device needs to be folded to be compact. However, when folding is performed so that it overlaps with the transmission-type display region 105, display is disturbed. Therefore, in one example, folding is performed so that it does not overlap with the transmission-type display region 105. In one example, folding is performed so that the non-transmission-type display region 104 and the IC chip 103 overlap. In addition, the arrangement of the non-transmission-type display region 104, the transmission-type display region 105, the flexible printed circuit 102, and the IC chip 103 is set so that folding is performed in such a manner.

Figure 2A:
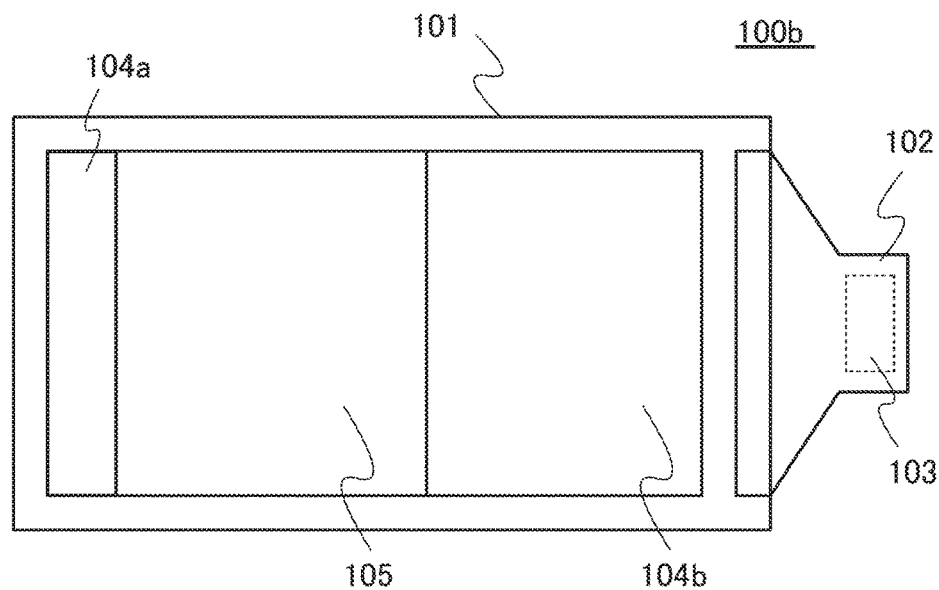
FIG. 2 Views illustrating an example of an electronic device.
Figure 2B:
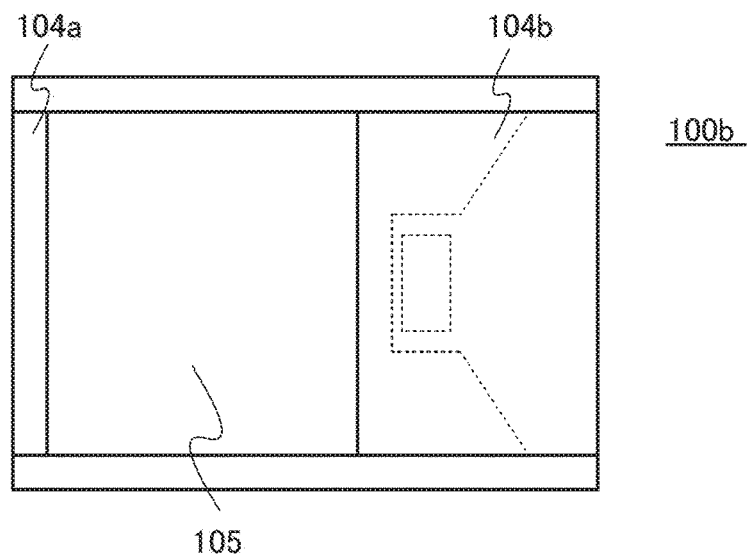
Figure 2C:
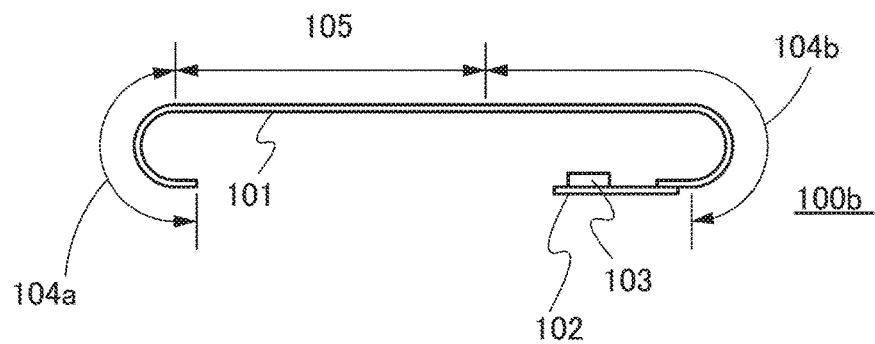

FIG. 2(A) to FIG. 2(C) illustrate an example of another display device. A display device 100b includes the flexible display substrate 101, the flexible printed circuit 102 connected thereto, and the IC chip 103 connected to the flexible printed circuit 102. Note that the IC chip 103 is provided on the back of the flexible printed circuit 102 in FIG. 2(A). In addition, the flexible display substrate 101 is provided with a non-transmission-type display region 104a, a non-transmission-type display region 104b, and the transmission-type display region 105. Note that, in one example, boundaries of the non-transmission-type display region 104a and the transmission-type display region 105 are in contact with each other and boundaries of the non-transmission-type display region 104b and the transmission-type display region 105 are in contact with each other.

In FIG. 2(A), a state in which the flexible printed circuit 102 is unfolded is illustrated. In FIG. 2(B), a state in which the flexible printed circuit 102 is folded is illustrated. In FIG. 2(C), a schematic cross-sectional view of the display device 100b in a state where the flexible printed circuit 102 is folded is illustrated. As illustrated in FIG. 2(C), the end portions of the display device 100b are bendable at certain radii of curvature. FIG. 2(B) illustrates a state in which the IC chip 103 is on the back of the flexible display substrate 101. In this example, folding is performed so that a portion where the opaque object such as the IC chip 103 and the flexible display substrate 101 overlap with each other or a portion where the flexible display substrate 101 overlaps with itself is prevented from being the transmission-type display region 105 or so that these portions overlap with the non-transmission-type display region 104a or the non-transmission-type display region 104b. Note that it is not necessary that these portions be completely prevented from being the transmission-type display region 105. Part of a portion where the left end of the flexible display substrate 101 overlaps with itself may be the non-transmission-type display region 104a as illustrated in FIG. 2(C), for example, to such a degree that problems in visibility do not occur. In addition, the arrangement of the non-transmission-type display region 104a, the non-transmission-type display region 104b, the transmission-type display region 105, the flexible printed circuit 102, and the IC chip 103 is set so that folding is performed in the above-described manner.

Figure 3A:
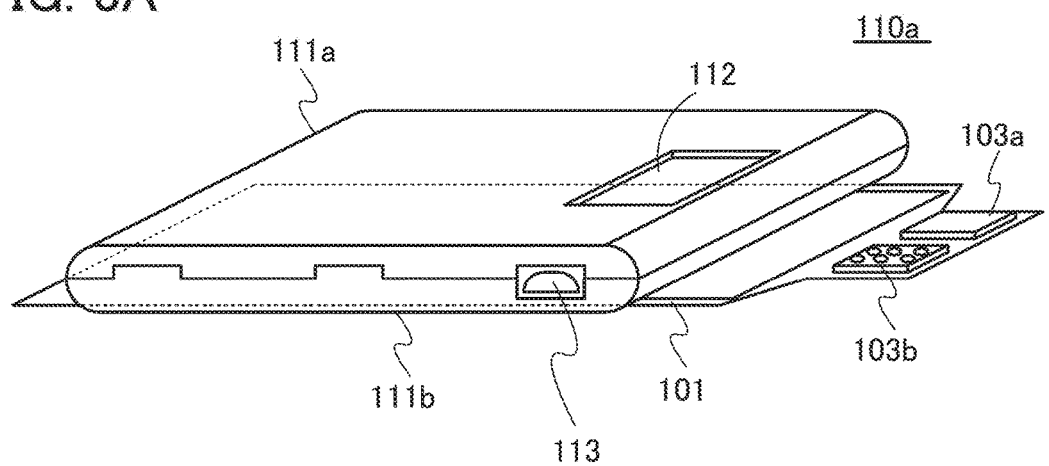
FIG. 3 Views illustrating an example of an electronic device.
Figure 3B:
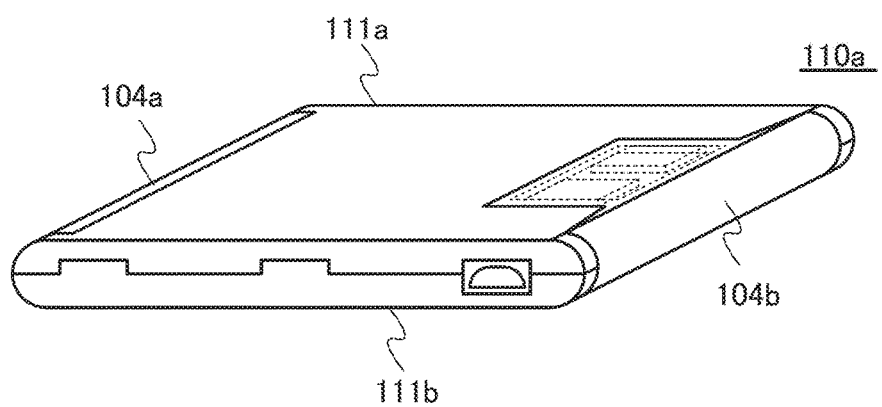
Figure 3C:
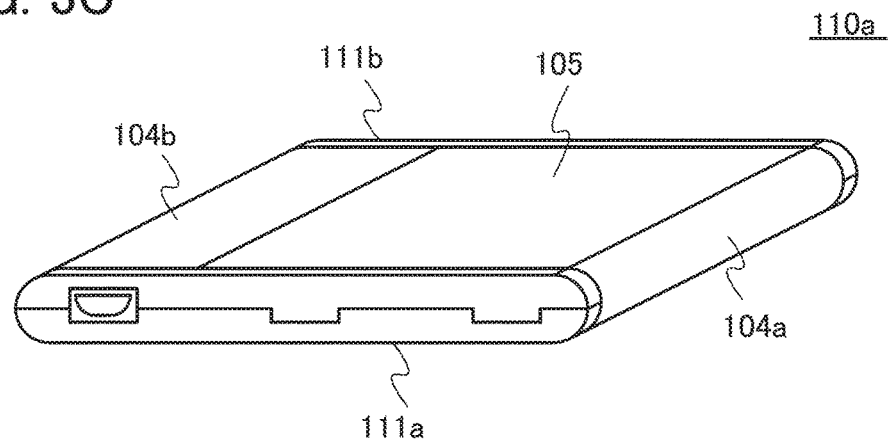

FIG. 3(A) to FIG. 3(C) illustrate an example of an electronic device including the above display device. An electronic device 110a illustrated in FIG. 3(A) includes a first housing 111a and a second housing 111b. The first housing 111a includes an opening 112, and an operation button 113 is provided at a connection portion between the first housing 111a and the second housing 111b. The first housing 111a and the second housing 111b include transparent portions, and the transparent portions partly or entirely overlap with each other. Therefore, the side across the second housing 111b is visible from the first housing 111a side at a portion where the transparent portions overlap. The first housing 111a and the second housing 111b are combined and united. Note that some electronic components, IC chips, batteries, boards (substrates), and the like may be included inside the first housing 111a and the second housing 111b. Parts of them or all of them are electrically connected to each other.

In the electronic device 110a, the flexible display substrate 101 is fixed to the first housing 111a and the second housing 111b. The flexible display substrate 101 includes an IC chip 103a and an IC chip 103b that are provided thereover. In one example, one forms an image signal, supplies it to the flexible display substrate 101, and controls the display. The other performs another arithmetic processing. Needless to say, it is not limited to this. In addition, three or more IC chips may be provided. The flexible display substrate 101 is provided with the non-transmission-type display region 104a, the non-transmission-type display region 104b, and the transmission-type display region 105 like the display device 100b.

FIG. 3(B) illustrates the electronic device 110a in a state where the flexible display substrate 101 is fixed to the first housing 111a and the second housing 111b. The IC chip 103a and the IC chip 103b are stored in the opening 112. In addition, as illustrated in FIG. 2(C), the non-transmission-type display region 104a and the non-transmission-type display region 104b are positioned at portions where the flexible display substrate 101 overlaps with itself (that is, bent end portions).

FIG. 3(C) illustrates an upside down state of the electronic device 110a illustrated in FIG. 3(B). At a portion where the flexible display substrate 101 overlaps with the IC chip 103a and the IC chip 103b (that is, the opening 112), the transmission-type display region 105 is positioned.

Figure 4:
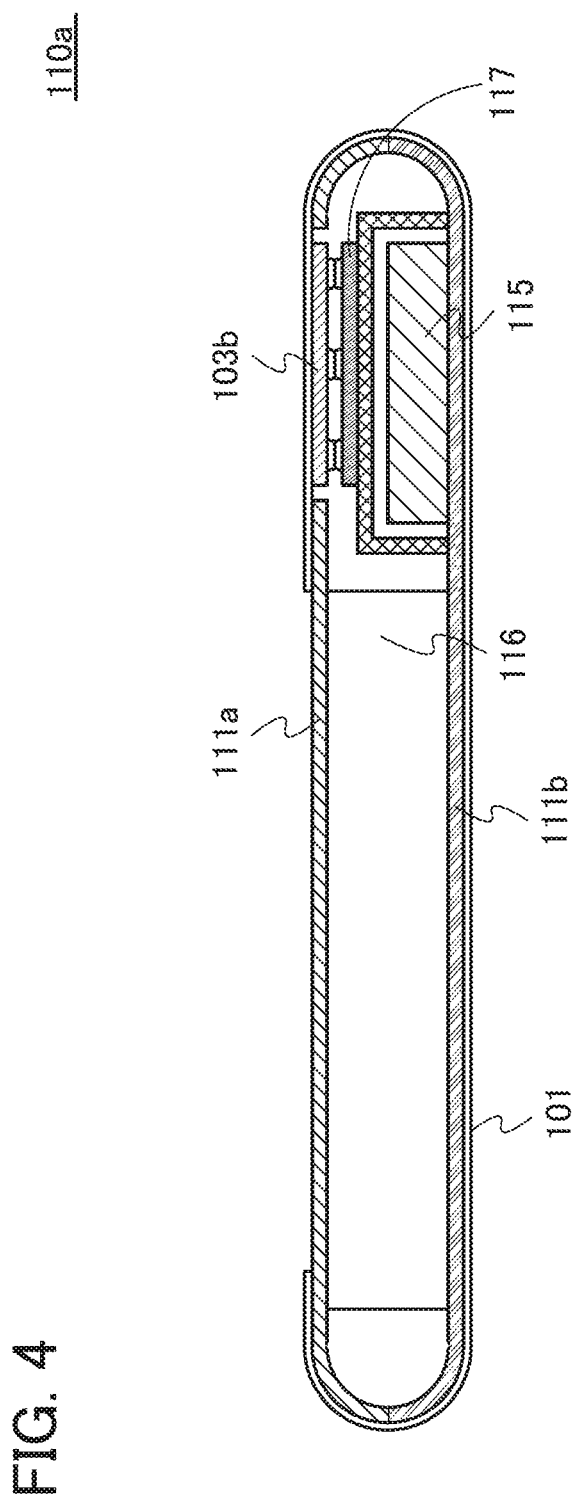
FIG. 4 A view illustrating an example of a cross-sectional structure of an electronic device.

FIG. 4 illustrates an example of a cross section of the electronic device 110a. A battery 115, a transparent filler 116, a board 117, and the like are included inside the first housing 111a and the second housing 111b. The IC chip 103a and the IC chip 103b are fixed to the board 117.

Figure 5:
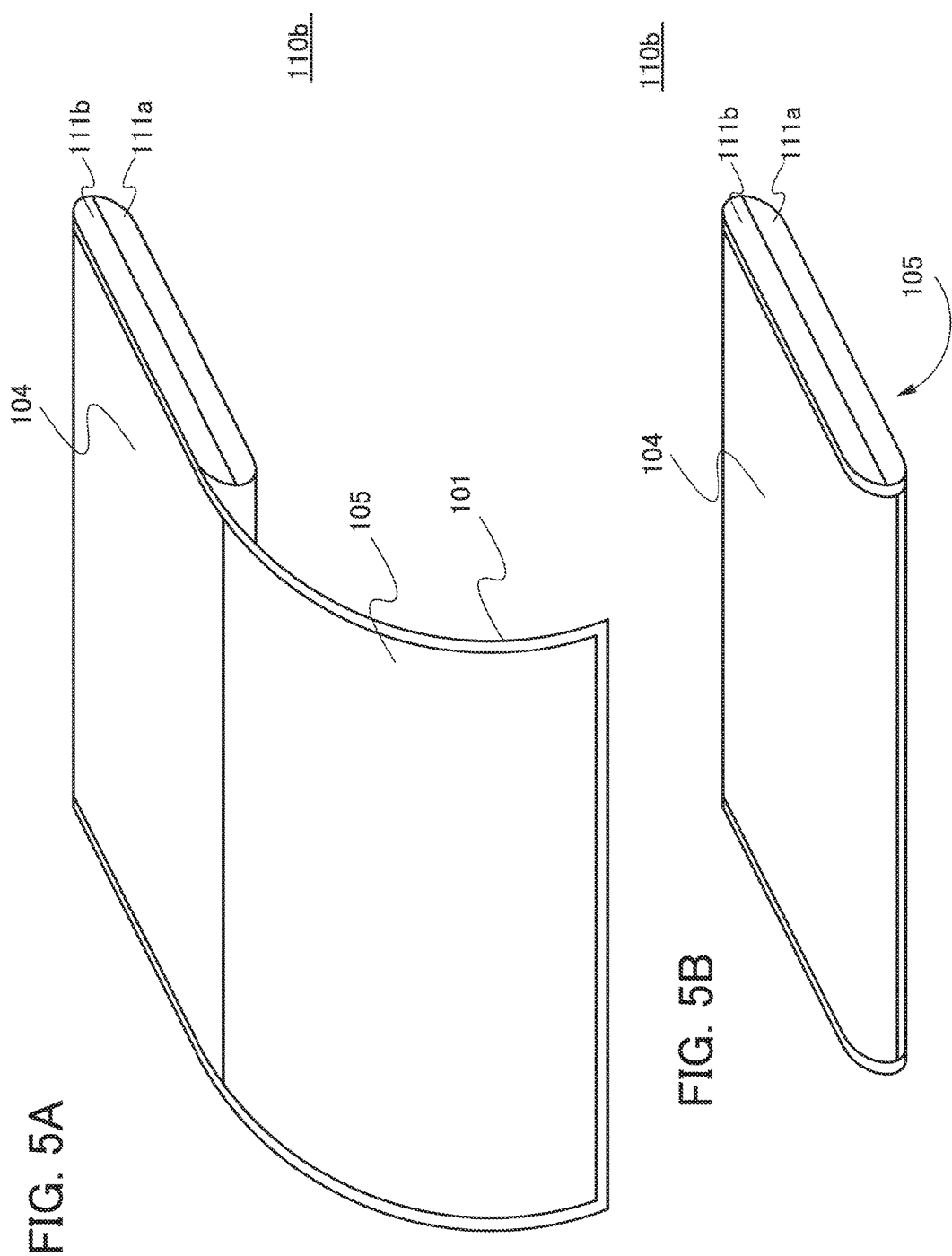
FIG. 5 Views illustrating an example of an electronic device.

In FIG. 5(A) and FIG. 5(B), an example of the electronic device 110b with another structure is illustrated. The electronic device 110b includes the first housing 111a and the second housing 111b. The first housing 111a and the second housing 111b are combined and united. In addition, the electronic device 110b includes the flexible display substrate 101 part of which is fixed to the first housing 111a and the second housing 111b.

FIG. 5(A) illustrates the flexible display substrate 101 that is unfolded, and FIG. 5(B) illustrates the flexible display substrate 101 that is stored. The flexible display substrate 101 includes the non-transmission-type display region 104 and the transmission-type display region 105.

In one example, part of or the whole of the first housing 111a and the second housing 111b are opaque. Almost all part of the non-transmission-type display region 104 is fixed so as to overlap with the first housing 111a. In addition, in one example, almost all part of the non-transmission-type display region 104 is fixed to the first housing 111a. In the meanwhile, the transmission-type display region 105 is not always fixed to the first housing 111a or the second housing 111b.

Figure 6:
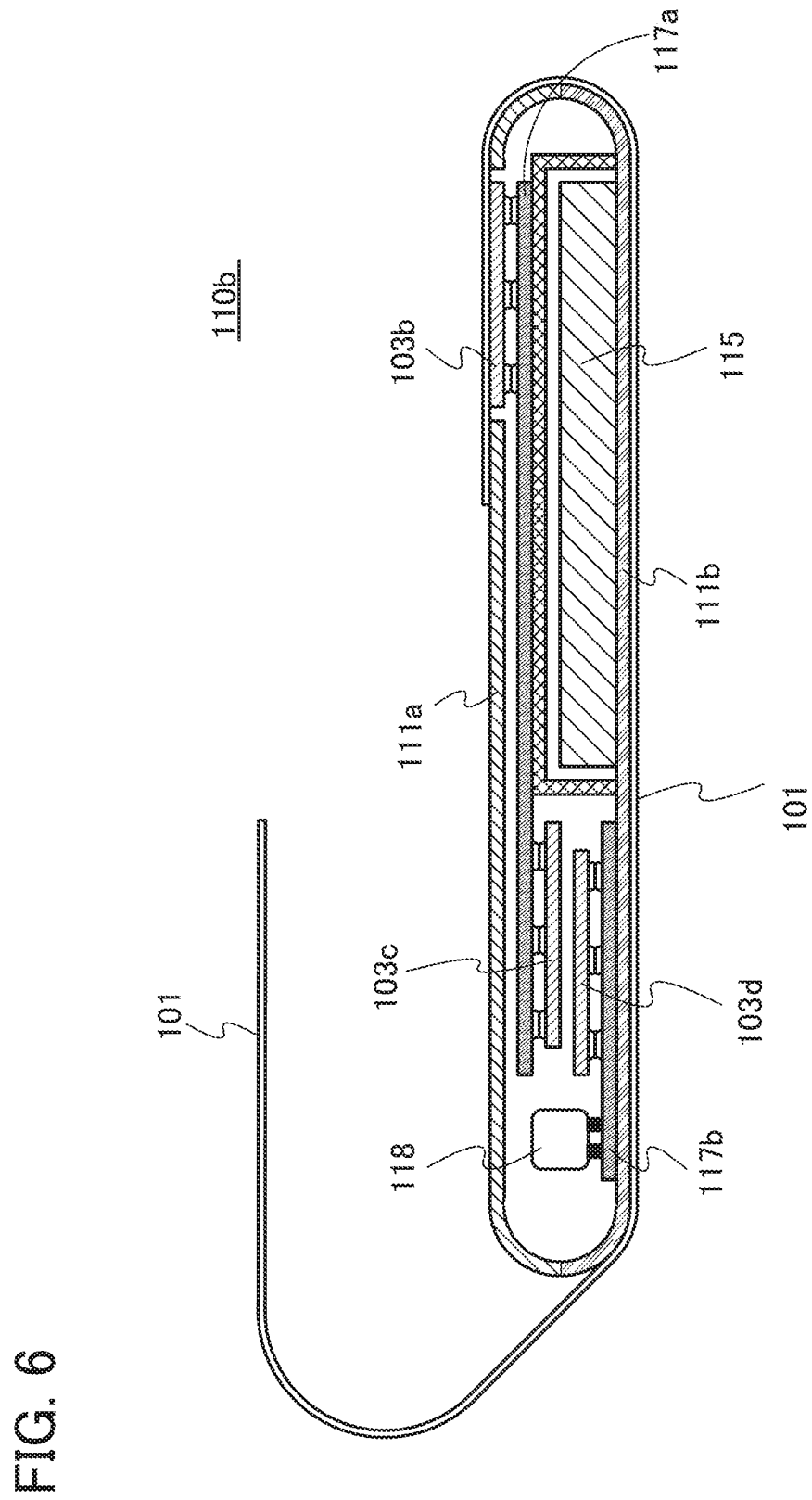
FIG. 6 A view illustrating an example of a cross-sectional structure of an electronic device.

FIG. 6 illustrates an example of a cross section of the electronic device 110b. The IC chip 103b, an IC chip 103c, an IC chip 103d, the battery 115, a board 117a, a board 117b, an electronic component 118, and the like are included inside the first housing 111a and the second housing 111b. Like in the case of the electronic device 110a, the IC chip 103b is stored in the opening of the first housing 111a and fixed to the board 117a.

Figure 7A:
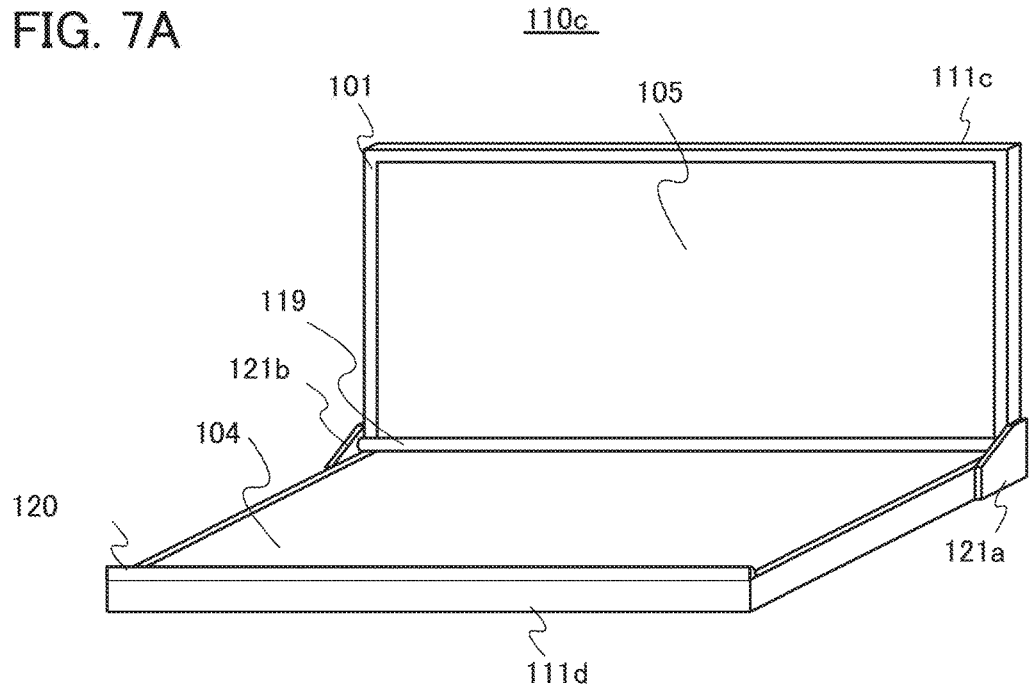
FIG. 7 Views illustrating an example of an electronic device.
Figure 7B:
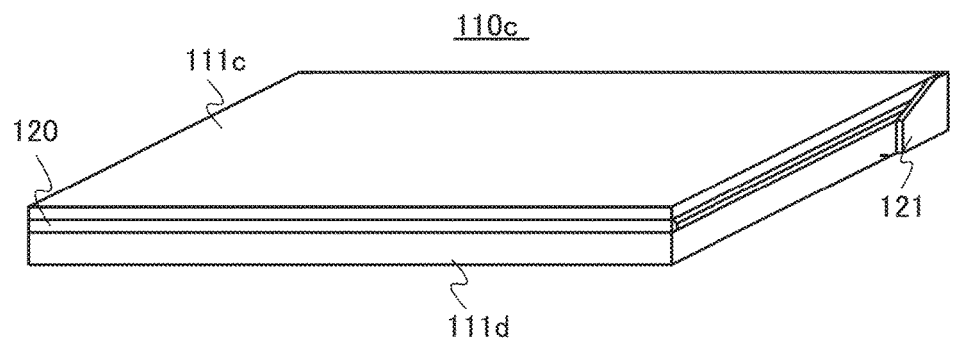
Figure 7C:
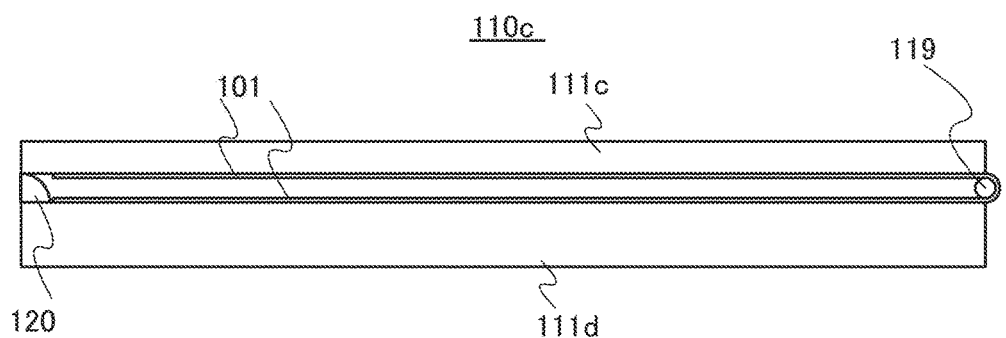

In FIG. 7(A) to FIG. 7(C), an example of the electronic device 110c with another structure is illustrated. The electronic device 110c includes a first housing 111c and a second housing 111d. The first housing 111c and the second housing 111d are connected by an axis support portion 121a and an axis support portion 121b and can open and shut. In addition, the electronic device 110c includes the flexible display substrate 101 part of which is fixed to the first housing 111c and the second housing 111d. The flexible display substrate 101 includes the non-transmission-type display region 104 and the transmission-type display region 105. An axis 119 is provided between the axis support portion 121a and the axis support portion 121b. The flexible display substrate 101 can be bent along the axis 119. Therefore, the flexible display substrate 101 can be prevented from being broken due to bending at an extremely small radius of curvature. Note that, in one example, the second housing 111d is provided with a stopper 120 having a height similar to the diameter of the axis 119. A magnet-type or mechanical-type fixture may be provided so that the stopper 120 and the first housing 111c are stably fixed.

FIG. 7(A) illustrates the electronic device 110c that is unfolded, and FIG. 7(B) illustrates a state where the electronic device 110c is folded. In addition, FIG. 7(C) illustrates a cross section of a folded state of the electronic device 110c.

In one example, part of or the whole of the first housing 111c is transparent. Part of or the whole of the second housing 111d is opaque. Almost all part of the non-transmission-type display region 104 is positioned so as to overlap with the second housing 111d. Almost all part of the transmission-type display region 105 is positioned so as to overlap with the first housing 111c.

For example, if the first housing 111c as a whole is transparent and the transmission-type display region 105 is formed using a dual-emission type organic electroluminescence display device, an image is visible through the first housing 111c by displaying the image on the transmission-type display region 105 even in a state where the electronic device 110c is folded. Alternatively, even if the transmission-type display region 105 is not formed using a dual-emission type display device, an image is visible through the transmission-type display region 105 and the first housing 111c by being displayed on the non-transmission-type display region 104.

Accordingly, when a small display screen is acceptable, the electronic device 110c is used in a state of being folded. When a larger display screen is needed, the electronic device 110c can be used in a state of being unfolded.

Figure 8A:
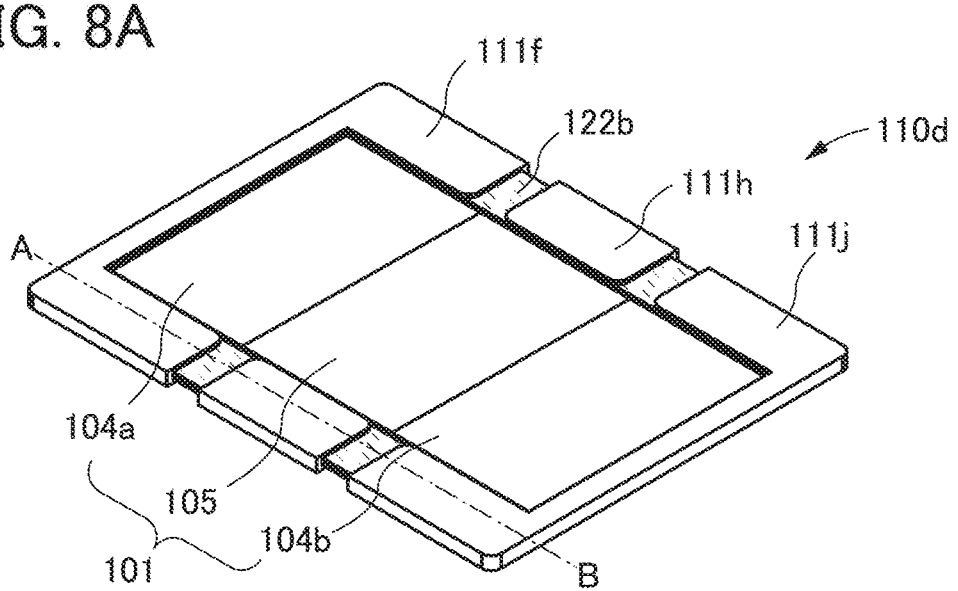
FIG. 8 Views illustrating an example of an electronic device.
Figure 8B:
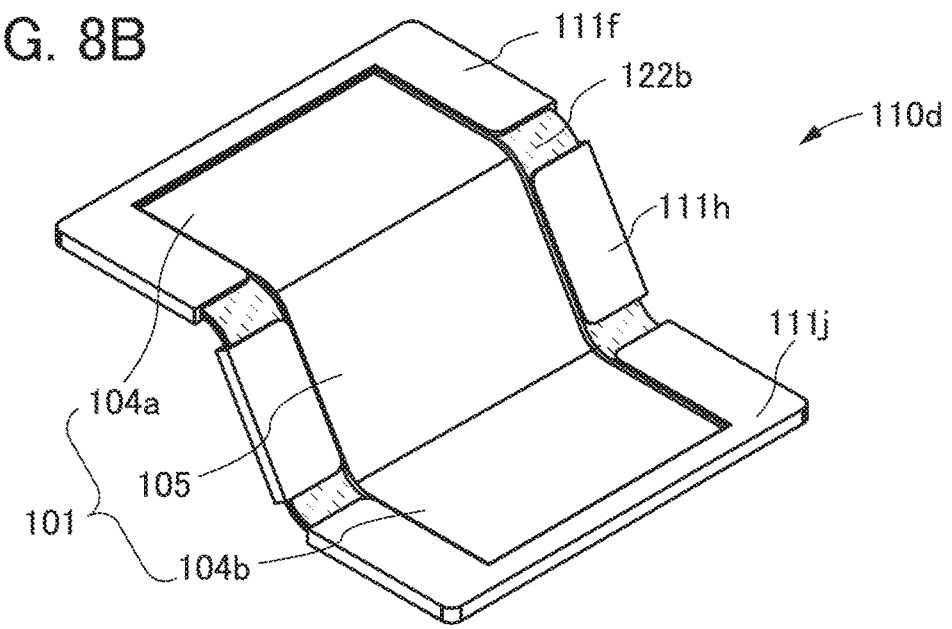
Figure 8C:
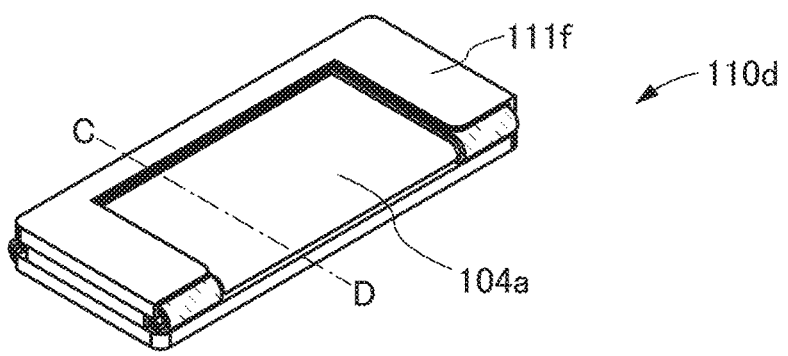
Figure 9:
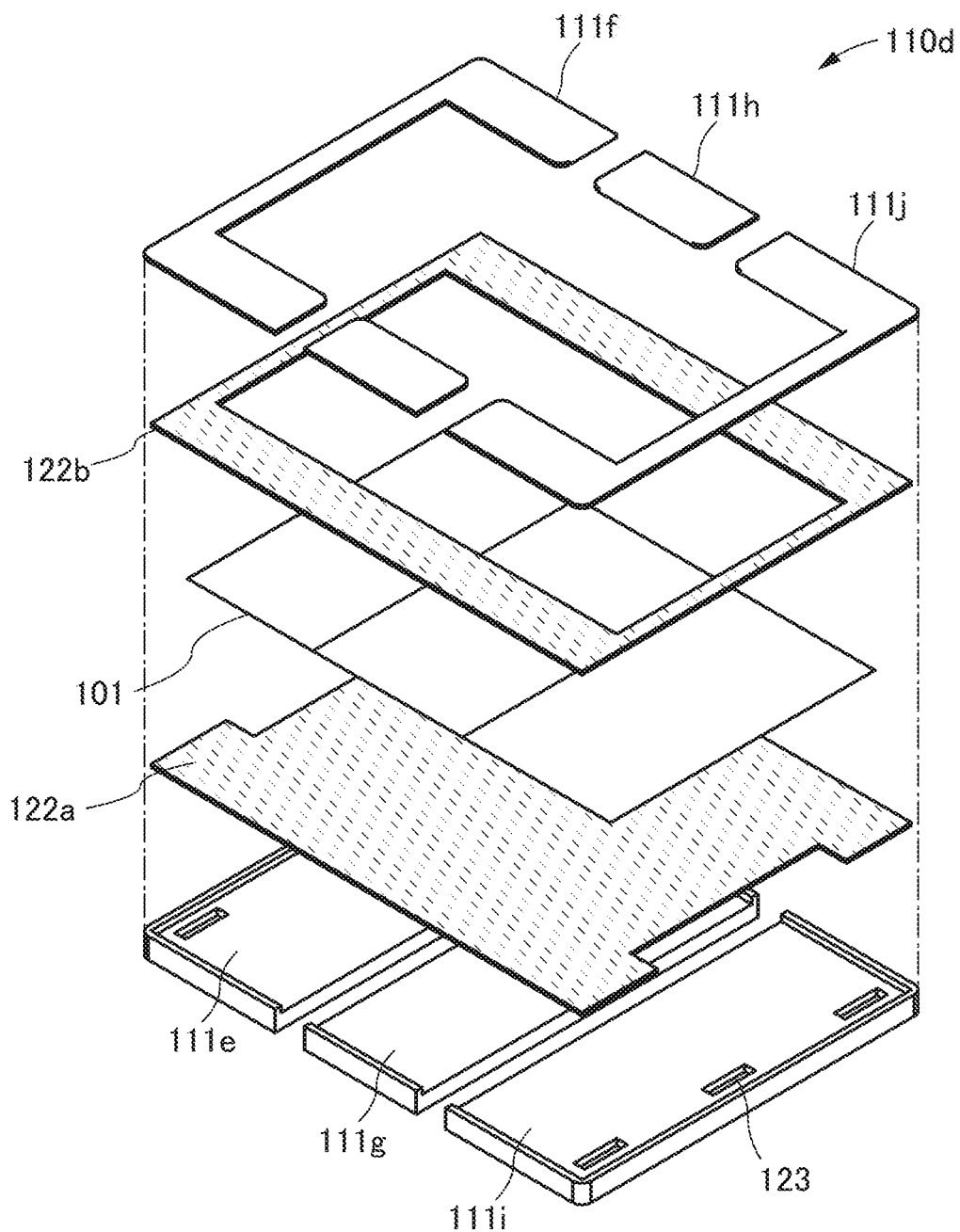
FIG. 9 A view illustrating an example of an electronic device.
Figure 10A:
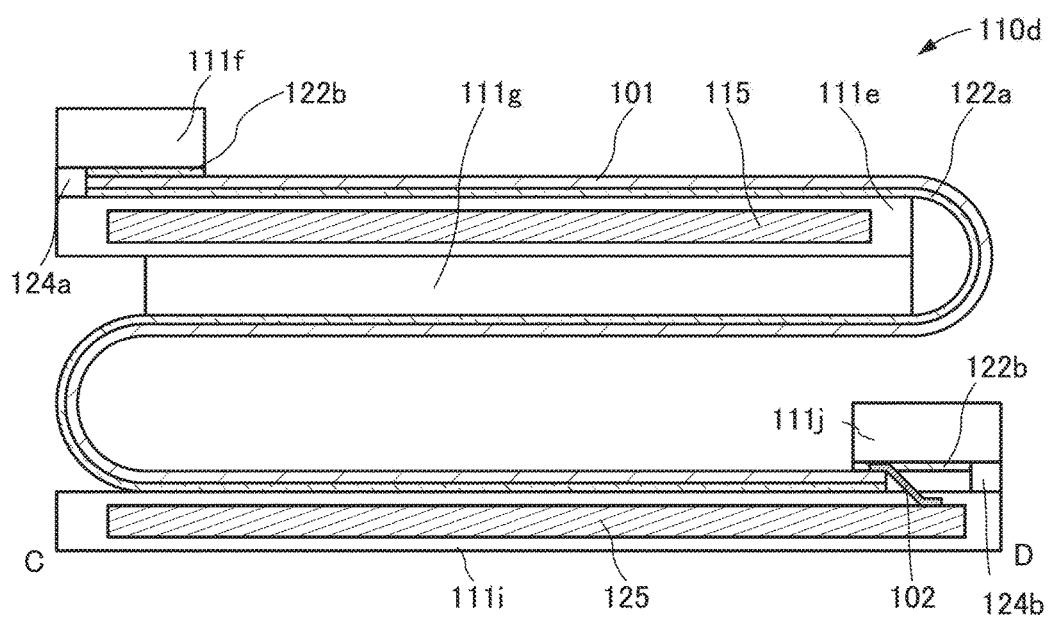
FIG. 10 Views illustrating examples of electronic devices.
Figure 10B:
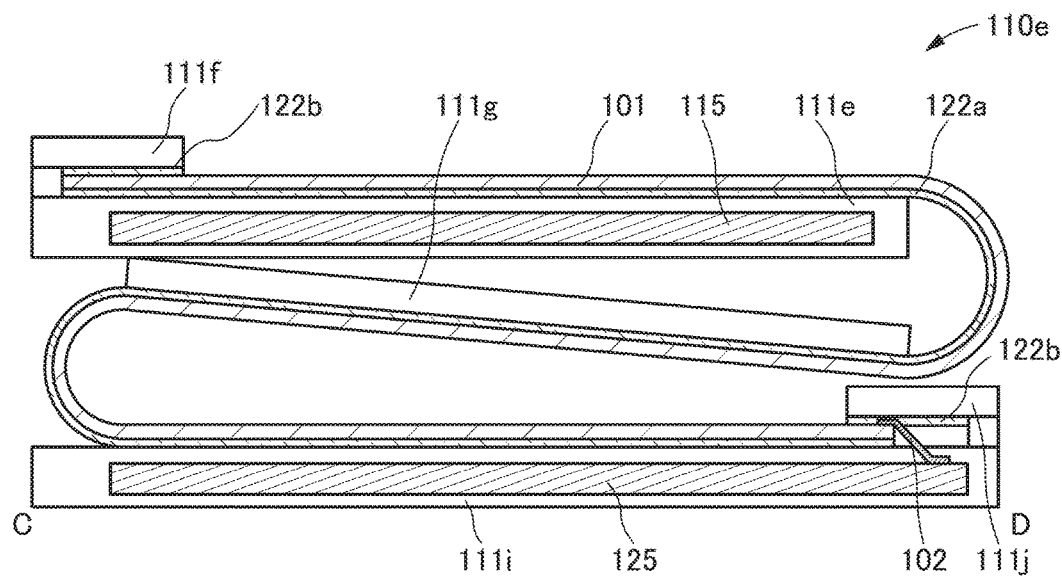

In FIG. 8 to FIG. 10, electronic devices with different structures are illustrated. In FIG. 8(A) to FIG. 8(C), conceptual views of an electronic device 110d are illustrated. FIG. 8(A) illustrates a state where the electronic device 110d is unfolded. FIG. 8(B) illustrates a state where the electronic device 110d that is changing from one of a state of being unfolded and a state of being folded into the other. FIG. 8(C) illustrates a state where the electronic device 110d is folded. The electronic device 110d includes the flexible display substrate 101 including the non-transmission-type display region 104a, the non-transmission-type display region 104b, and the transmission-type display region 105. FIG. 9 illustrates a stacked structure of the electronic device 110d in a state where the electronic device 110d is unfolded. FIG. 10(A) and FIG. 10(B) are states where the electronic device 110d is folded and illustrate a CD cross section of FIG. 8(C).

The electronic device 110d may be provided with a means such as a switch or a sensor (not illustrated) for noticing·detecting a state of the electronic device 110d (whether folded or unfolded, or the like). In addition, in a state where the electronic device 110d is folded as illustrated in FIG. 8(C), driving may be performed such that only a region of the uppermost surface and a region of the side surface connecting to the region (that is, a side surface region on the right side of the uppermost surface of the display region in the drawing) are selectively used as a display region and the other portions are not used as a display region. In this way, unnecessary power consumption can be prevented in the folded state.

As illustrated in FIG. 9, there are a first housing 111e, a third housing 111g, and a fifth housing 111i for supporting the display panel under (on the back of) the flexible display substrate 101. A circuit, an electronic component, a battery, and the like can be stored inside these housings. In addition, the housings may be formed using a material such as a metal, a resin, or a rubber, a combination thereof, or the like to have a function of protecting the display panel, or a circuit or an electronic component contained inside, from the impact of being hit, dropping, or the like. Furthermore, the third housing 111g is formed using a material which is transparent to visible light (a material having an average transmittance to each wavelength of visible light of 50% or higher).

The upper side (display surface side) of the periphery of the flexible display substrate 101 is provided with a second housing 111f, a fourth housing 111h, and a sixth housing 111j. The flexible display substrate 101 is supported so as to be interposed between the housings on the lower side (the first housing 111e, the third housing 111g, and the fifth housing 111i) and the corresponding housings on the upper side (the second housing 111f, the fourth housing 111h, and the sixth housing 111j). A material of the first housing 111e, the third housing 111g, and the fifth housing 111i can be used as a material of the second housing 111f, the fourth housing 111h, and the sixth housing 111j.

Although each of the housings may be fixed by fixing means such as an adhesive or a screw, these components may be formed as one material using the same material. In that case, a structure may be used in which a space for holding the flexible display substrate 101 is provided and it is interposed there. In addition, as illustrated in FIG. 10(A), a side frame member 124a and a side frame member 124b may be provided. The side frame member 124a and the side frame member 124b may be formed using a material such as a metal, a resin, or a rubber.

The radius of curvature at the bendable portion may be greater than or equal to 1 mm and less than or equal to 100 mm.

A circuit or electronic component such as a control unit, a power supply unit, a storage battery, or an antenna is stored in at least one of the first housing 111e and the fifth housing 111i. The flexible printed circuit 102 may be used for the connection between the circuit or electronic component and the display panel.

In the electronic device 110d, a transparent flexible substrate 122a is provided between the display panel and the first housing 111e, the third housing 111g, and the fifth housing 111i. The flexible substrate 122a has substantially the same size as the flexible display substrate 101, and has a function of connecting between the first housing 111e, the third housing 111g, and the fifth housing 111i. In order to connect the flexible printed circuit 102 extending from the flexible display substrate 101 to the first housing 111e, the third housing 111g, and the fifth housing 111i, part of the flexible substrate 122a may be cut off or the flexible substrate 122a may be slightly smaller than the flexible display substrate 101. The material of the flexible substrate 122a may be a resin, a rubber, or the like, in which case the mechanical strength of the bendable portion can be reinforced. Furthermore, a wiring for connecting the circuits or electronic components provided in the first housing 111e or the fifth housing 111i may be provided inside or on the surface of the flexible substrate 122a.

A flexible substrate 122b may be provided between the display panel and the second housing 111f, the fourth housing 111h, and the sixth housing 111j. As illustrated in FIG. 9, the middle portion of the flexible substrate 122b is cut off; however, it may have the same structure as the flexible substrate 122a if forming using a transparent material. Note that both of or either one of the flexible substrate 122a and the flexible substrate 122b may be omitted.

The flexible printed circuit 102 is connected to the flexible display substrate 101, and connected to a control unit 125 and the like provided in the first housing 111e or the fifth housing 111i. Although it need not be limited to this, the flexible printed circuit 102 may be connected to the driver circuit provided inside the housing through an opening 123 provided in the first housing 111e or the fifth housing 111i.

An electronic device 110e illustrated in FIG. 10(B) is a modification example, in which the third housing 111g is thinner than the first housing 111e or the fifth housing 111i.

Note that the electronic device 110d and the electronic device 110e need not be limited to having two foldable points for folding in three, and it is possible to have one, three, or four foldable points for folding in two, four, or five, for example. In addition, a way of folding the electronic device 110d and the electronic device 110e is not limited to the embodiment. For example, not the left but the rightmost portion may become the uppermost surface or it is possible to perform folding so that the center portion becomes the uppermost surface.

Another structure of an electronic device will be described with reference to FIG. 11 and FIG. 12.

FIG. 11 is a hexahedral view illustrating an unfolded state of a display portion of the electronic device 110f.

FIG. 12 are views illustrating a folded state of the display portion of the electronic device 1101 FIG. 12(A) is a hexahedral view, and FIG. 12(B) is a cross-sectional view along cutting plane line A-A'.

In the flexible display substrate 101, the non-transmission-type display region 104a, the transmission-type display region 105, and the non-transmission-type display region 104b are arranged in this order. The display portion which can be folded and unfolded along a first fold line formed between the non-transmission-type display region 104a and the transmission-type display region 105 and a second fold line formed between the transmission-type display region 105 and the non-transmission-type display region 104b is included (see FIG. 11 and FIG. 12).

The electronic device 110f further includes a board 117 equipped with the arithmetic device which is supplied with a power supply potential and supplies image data, the battery 115 for supplying the power supply potential, and the housing 111 in which they are stored (see FIG. 12(B)).

The flexible display substrate 101 which is supplied with image data displays image data.

The flexible display substrate 101 is provided so as to be bendable along a side surface of the housing 111, and image data can be displayed on a side surface and a back surface of the electronic device 110f (see FIG. 12(A)). Note that almost all part of the non-transmission-type display region 104b is fixed to the housing 111.

The flexible display substrate 101 may include a frame 126 (a non-display region) outside the non-transmission-type display region 104a, the transmission-type display region 105, and the non-transmission-type display region 104b. The frame 126 is not necessarily provided with a display element and may be provided with a display element. In the latter case, an image signal for performing non-display may be supplied.

A touch sensor can be provided so as to overlap with the non-transmission-type display region 104a, the transmission-type display region 105, and the non-transmission-type display region 104b. The display portion with which the touch sensor overlaps can be called a touch panel.

The touch panel can supply positional data, and the arithmetic device is supplied with the positional data from the touch panel.

Note that this embodiment can be combined with the other embodiments described in this specification as appropriate.

(Embodiment 2)

Figure 13:
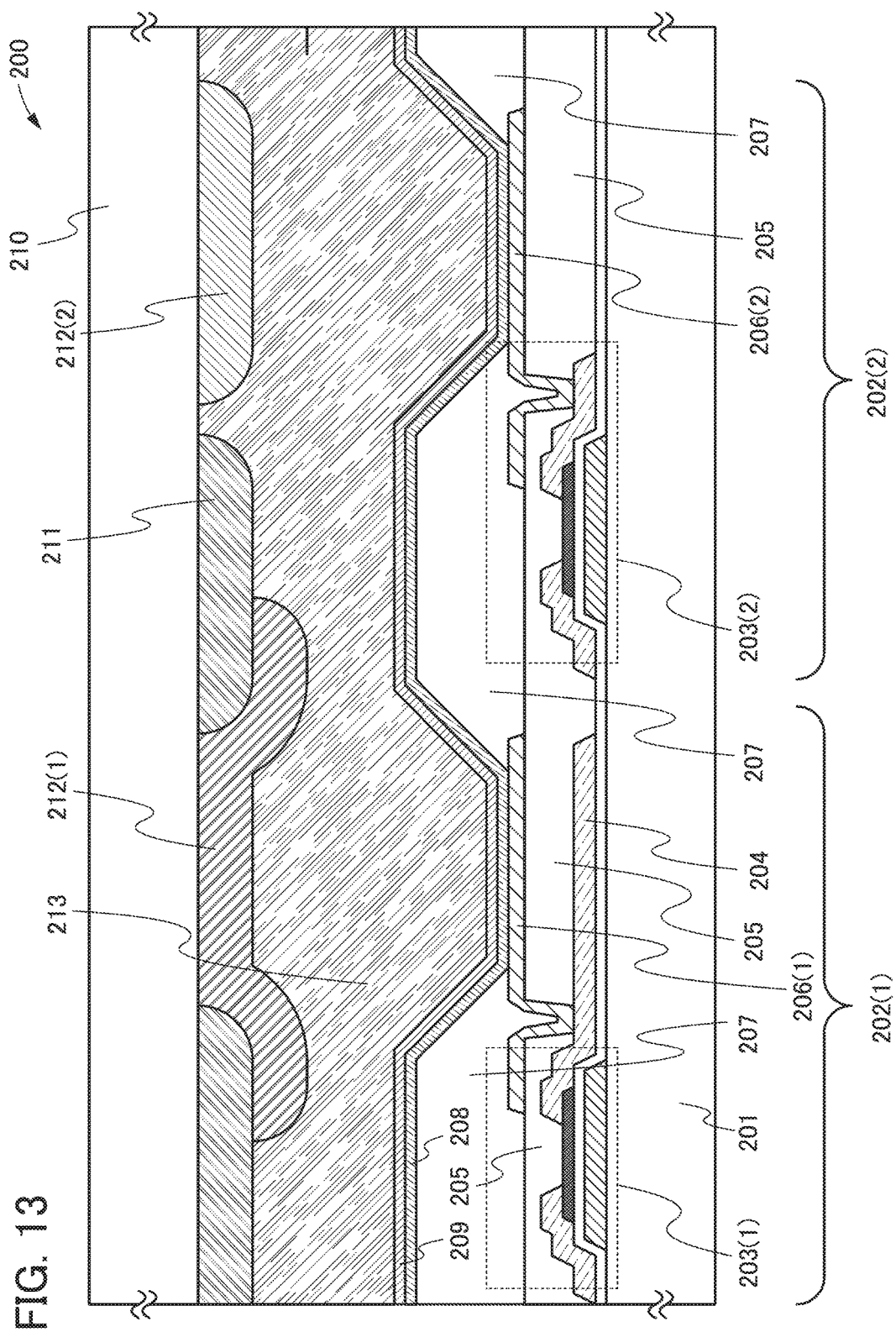
FIG. 13 A view illustrating an example of a cross-sectional structure of an electronic device.

FIG. 13 illustrates a display device 200 which can be used for the flexible display substrate 101 in the above embodiment. Of course, a device with another structure can also be used for the flexible display substrate 101. The display device 200 has a structure in which a flexible substrate 201 and a flexible substrate 210 are bonded using an adhesive layer 213. Note that the flexible substrate 201 may be flexible as a whole, and can also be an organic resin film provided with an inorganic insulating film, for example. The same can be said for the flexible substrate 210.

The flexible substrate 201 is provided with a pixel 202 (a pixel 202(1) and a pixel 202(2) are illustrated in FIG. 13).

The pixel 202 includes a transistor 203 and a transparent electrode 206 connected thereto. In addition, a light-emitting material layer 208 and an electrode layer 209 are provided to cover the transparent electrode. The pixels 202 can be electrically isolated by a partition wall 207. Note that an insulating layer such as an insulating layer 205 is also provided over the flexible substrate 201.

Note that the pixel 202(1) is a reflective-type pixel, and light emitted from the light-emitting material layer 208 in the pixel 202(1) is reflected by a reflective layer 204 and is visible only from the flexible substrate 210 side. In the meanwhile, the pixel 202(2) is a transmission-type pixel, and light emitted from the light-emitting material layer 208 in the pixel 202(2) is visible from any of the flexible substrate 201 side and the flexible substrate 210 side. Furthermore, when the light-emitting material layer 208 in the pixel 202 (2) does not emit light or has a low light emission intensity, the view behind the flexible substrate 210 is visible through the flexible substrate 201.

The flexible substrate 210 is provided with a light-blocking layer 211 and a color filter 212. Note that in the transmission-type pixel (the pixel 202(2) and the like), an area occupied by the light-blocking layer 211 may be the smallest. In addition, a region where the light-blocking layer 211 and the color filter 212 do not overlap with each other may be provided. Note that the light-blocking layer 211 or an object having a function equivalent thereto may be provided on the flexible substrate 201 side. For example, a metal film pattern covering the transistor 203 is provided and used as a light-blocking layer; thus, a structure in which external light does not enter the transistor 203 can be achieved. The characteristics of the transistor 203 can also be improved by keeping this metal film pattern at an appropriate potential or being applied with signals.

Figure 14A:
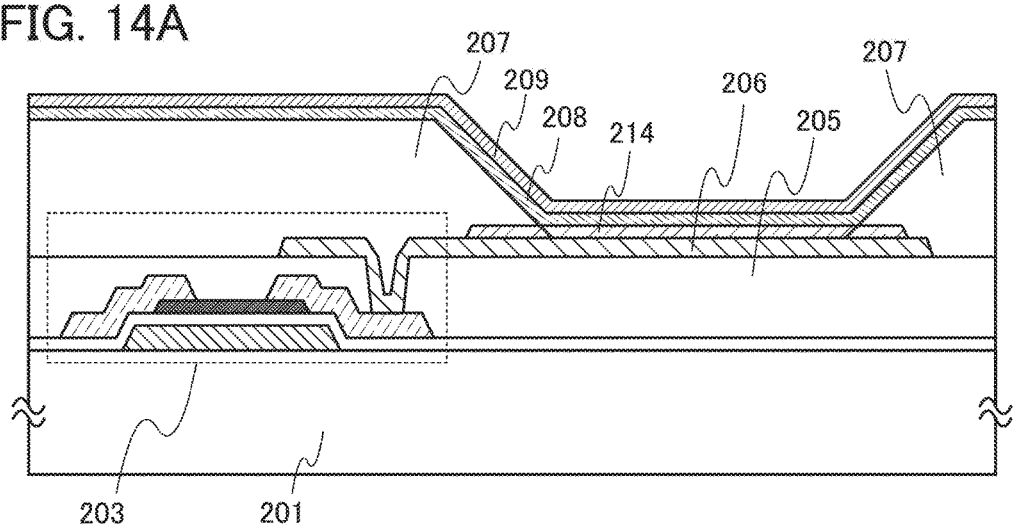
FIG. 14 Views illustrating examples of cross-sectional structures of an electronic device.
Figure 14B:
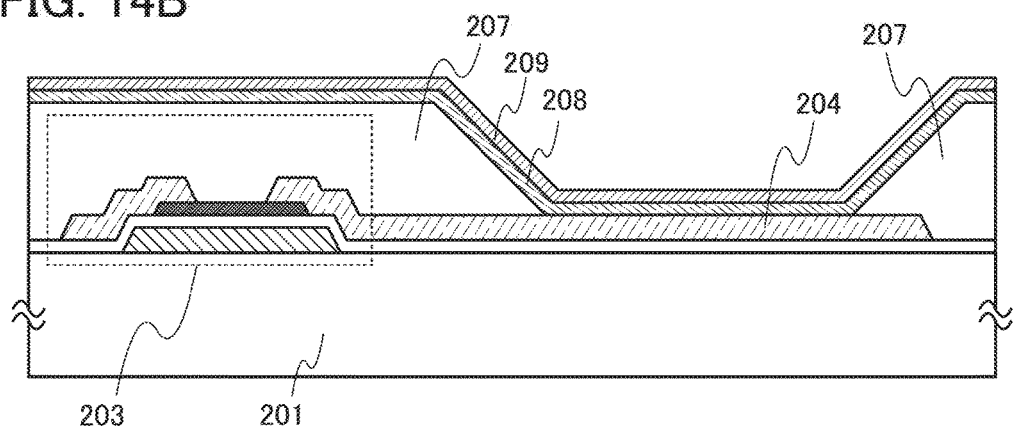
Figure 14C:
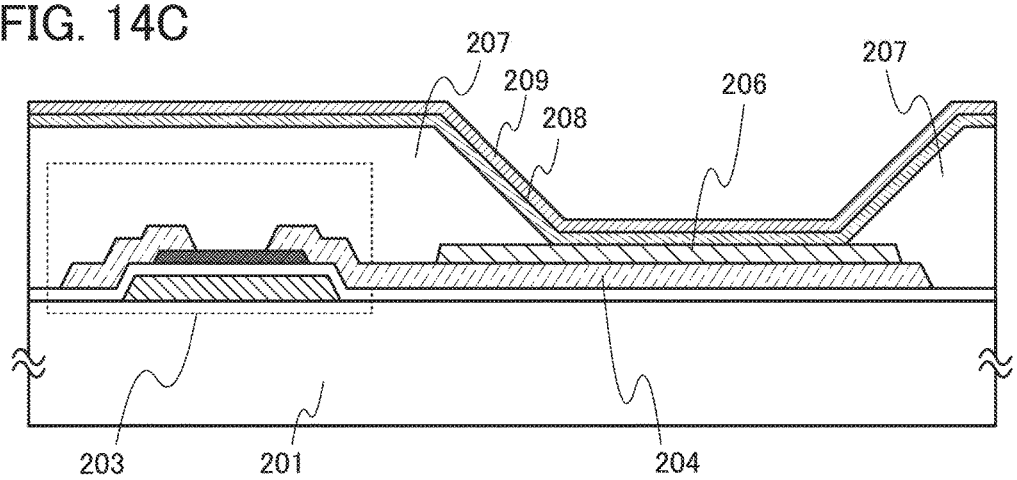

A reflective-type pixel is not limited to the pixel 202(1) of FIG. 13. FIG. 14(A) to FIG. 14(C) illustrate other examples of reflective-type pixels. A pixel illustrated in FIG. 14(A) is provided with a reflective electrode 214 between the transparent electrode 206 and the light-emitting material layer 208. A pixel illustrated in FIG. 14(B) has a structure in which the insulating layer 205 and the transparent electrode 206, which are provided between the reflective layer 204 and the light-emitting material layer 208 of FIG. 13, are not provided. A pixel illustrated in FIG. 14(C) has a structure in which the insulating layer 205, which is provided between the reflective layer 204 and the light-emitting material layer 208 of FIG. 13, is not provided.

Figure 15A:
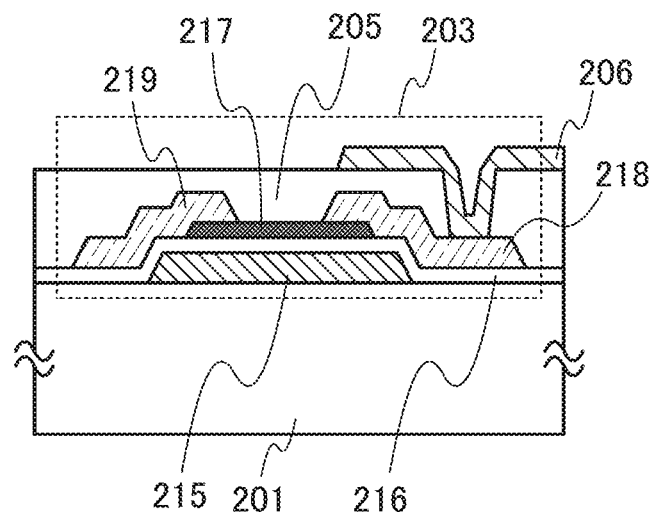
FIG. 15 Views illustrating examples of cross-sectional structures of an electronic device.
Figure 15B:
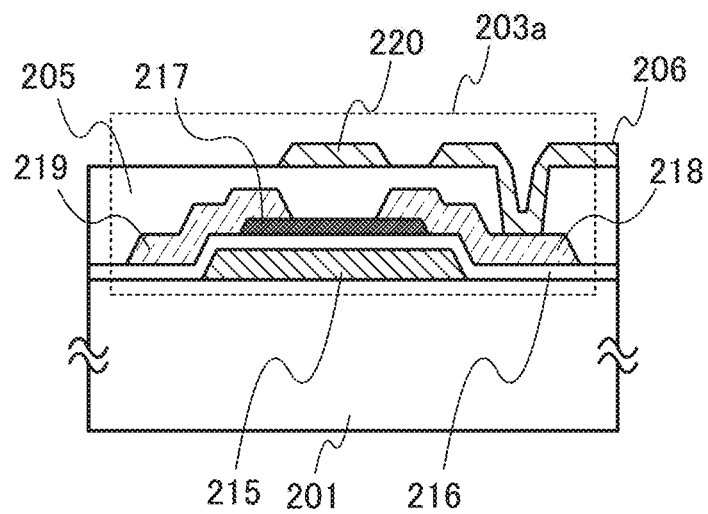

Structure examples of the transistor 203 will be described with reference to FIG. 15(A) and FIG. 15(B). The transistor 203 used in the pixels illustrated in FIG. 13 and FIG. 14(A) has a structure illustrated in FIG. 15(A). The transistor 203 includes a gate wiring 215, an insulating layer 216 (functioning as an interlayer insulator or a gate insulator), a semiconductor layer 217, an electrode 218, and an electrode 219. The electrode 218 is connected to the transparent electrode 206 through an opening provided in the insulating layer 205. The insulating layer 205 is not provided for the use in the pixels illustrated in FIG. 14(B) and FIG. 14(C). Furthermore, a second gate wiring 220 may be provided like a transistor 203a illustrated in FIG. 15(B). Note that the structure of transistors used in pixels is not limited to them.

Figure 16A:
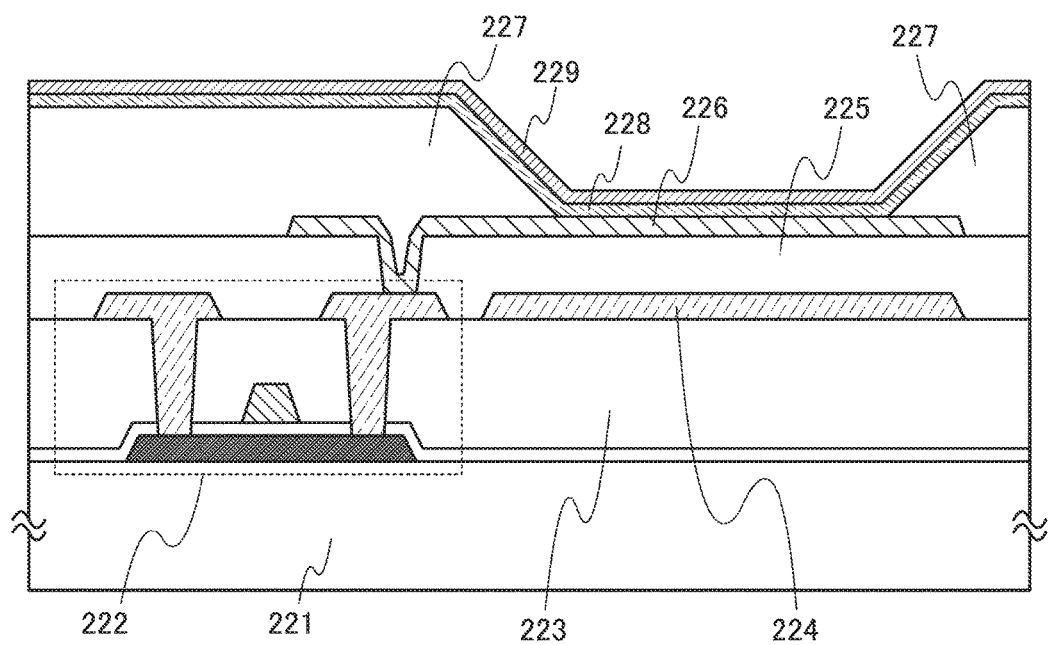
FIG. 16 Views illustrating an example of a cross-sectional structure of an electronic device.

FIG. 16(A) illustrates an example of a pixel with another structure. The pixel described here includes a top-gate-type transistor 222 provided over the flexible substrate 221, an insulating layer 223 covering it, a reflective layer 224 over the insulating layer 223, an insulating layer 225 covering it, a transparent electrode 226 which is provided over the insulating layer 225 and connected to the transistor 222, a partition wall 227 which is selectively formed over the transparent electrode 226, and a light-emitting material layer 228 and an electrode layer 229 which are provided over the transparent electrode 226 and the partition wall 227.

Figure 16B:
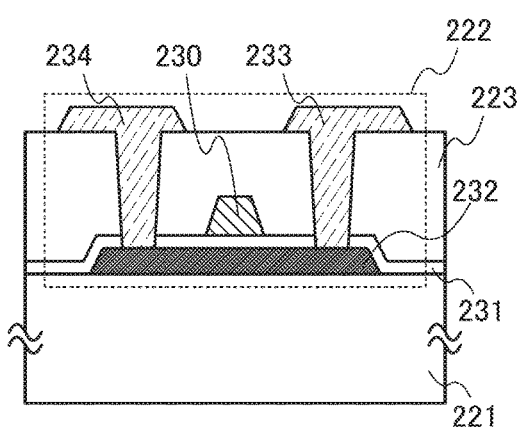

A detailed example of a structure of the transistor 222 is illustrated in FIG. 16(B). The transistor 222 includes a gate wiring 230, an insulating layer 231, a semiconductor layer 232, and an electrode 233 and an electrode 234 which are connected to the semiconductor layer 232 through openings provided in the insulating layer 231 and the insulating layer 223.

Next, a method for fabricating any of the electronic device 110a to the electronic device 110f which are described in the above embodiments will be described with reference to FIG. 17(A) to FIG. 17(D), FIG. 18(A) to FIG. 18(C), and FIG. 19(A) to FIG. 19(C).

Figure 17A:
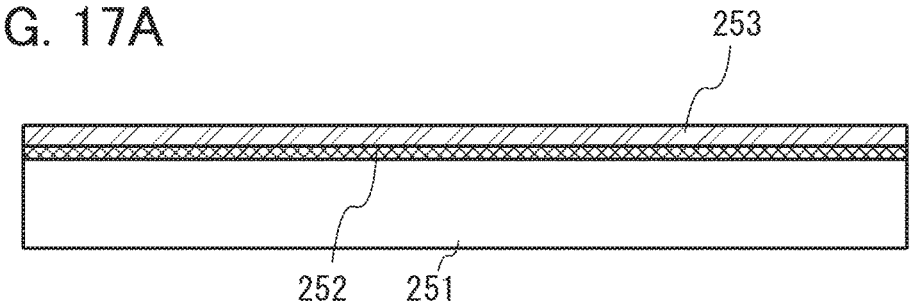
FIG. 17 Views illustrating an example of fabricating steps of an electronic device.

As illustrated in FIG. 17(A), a first separation layer 252 is formed over a first substrate 251, and a first element layer 253 is formed thereover. As the first element layer 253, an element layer including an active element such as a thin film transistor, a display element such as a light-emitting diode, a pixel electrode, a color filter, a light-blocking layer, or the like may be formed. Furthermore, some layer or film may be provided over the first element layer 253.

As the first substrate 251, a glass substrate, a quartz substrate, a sapphire substrate, a ceramic substrate, a metal substrate, or the like can be used. For the glass substrate, for example, a glass material such as aluminosilicate glass, aluminoborosilicate glass, or barium borosilicate glass can be used.

In the case where a glass substrate is used as the first substrate 251, when an insulating film such as a silicon oxide film, a silicon oxynitride film, a silicon nitride film, or a silicon nitride oxide film is formed between the first substrate 251 and the first separation layer 252, contamination from the first substrate 251 can be prevented.

The first separation layer 252 is formed using an element selected from tungsten, molybdenum, titanium, tantalum, niobium, nickel, cobalt, zirconium, zinc, ruthenium, rhodium, palladium, osmium, iridium, and silicon; an alloy material containing these elements; or a compound material containing these elements, and is a single layer or a stacked layer. A crystal structure of a layer containing silicon may be any of amorphous, microcrystalline, or polycrystalline.

The first separation layer 252 can be formed by a sputtering method, a plasma CVD method, a coating method, a printing method, or the like. Note that a coating method includes a spin coating method, a droplet discharge method, and a dispensing method.

In the case where the first separation layer 252 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds to an alloy of tungsten and molybdenum, for example.

In addition, in the case where a stacked-layer structure including a layer containing tungsten and a layer containing an oxide of tungsten is formed as the first separation layer 252, it may be utilized that the layer containing an oxide of tungsten is formed at the interface between the tungsten layer and the insulating film by forming the layer containing tungsten and forming an insulating film formed of an oxide thereover. Alternatively, the layer containing an oxide of tungsten may be formed by performing thermal oxidation treatment, oxygen plasma treatment, treatment with a highly oxidizing solution such as ozone water, or the like on the surface of the layer containing tungsten. Furthermore, plasma treatment or heat treatment may be performed in an atmosphere of oxygen, nitrogen, or nitrous oxide, or a mixed gas of these gasses and another gas. Surface condition of the first separation layer 252 is changed by the above plasma treatment or heat treatment, whereby adhesion between the first separation layer 252 and the first element layer 253 or the like which is formed thereover can be controlled.

Note that an inorganic insulating layer may be provided between the first element layer 253 and the first separation layer 252. As the inorganic insulating layer, a silicon nitride film, a silicon oxynitride film, a silicon nitride oxide film, and the like are preferably formed as a single layer or a multilayer. The inorganic insulating layer can be formed by a sputtering method, a plasma CVD method, a coating method, a printing method, or the like. When formed at a deposition temperature of higher than or equal to 250° C. and lower than or equal to 400° C. by a plasma CVD method, for example, it can be a dense film with very low water permeability.

On the other hand, a second separation layer 257 is formed over one surface of a second substrate 255, and a second element layer 256 is further formed. As the second substrate 255, one similar to the first substrate 251 can be used. In the case where the second element layer 256 is formed at a high processing temperature, one capable of withstanding the processing temperature can be used. Note that when a large amount of barium oxide (BaO) is contained, more practical thermal resistance can be obtained. Alternatively, crystallized glass or the like can be used. For the second separation layer 257, a material similar to that of the first separation layer 252 can be used.

In the case where a glass substrate is used as the second substrate 255, when an insulating film such as a silicon oxide film, a silicon oxynitride film, a silicon nitride film, or a silicon nitride oxide film is formed between the second substrate 255 and the second separation layer 257, contamination from the second substrate 255 can be prevented.

Note that an inorganic insulating layer may be provided between the second element layer 256 and the second separation layer 257. As the inorganic insulating layer, a silicon nitride film, a silicon oxynitride film, a silicon nitride oxide film, and the like are preferably formed as a single layer or a multilayer. The inorganic insulating layer can be formed by a sputtering method, a plasma CVD method, a coating method, a printing method, or the like. When formed at a deposition temperature of higher than or equal to 250° C. and lower than or equal to 400° C. by a plasma CVD method, for example, it can be a dense film with very low water permeability.

Figure 17B:
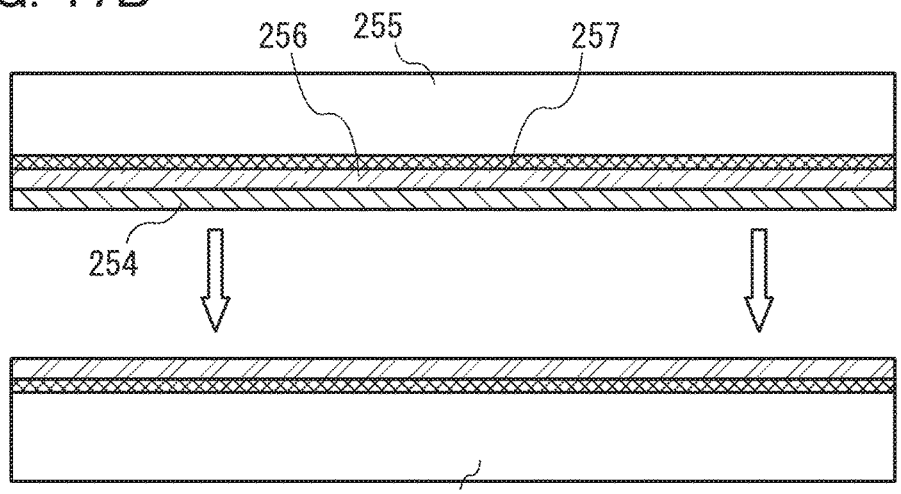

In the second element layer 256, an active element such as a thin film transistor, a display element such as a light-emitting diode, a pixel electrode, a color filter, a light-blocking layer, or the like may be formed. A first adhesive layer 254 is formed over the second element layer 256 and is bonded to the first element layer 253 of the first substrate 251 as illustrated in FIG. 17(B). Note that in the case where a layer including some element is formed over the first element layer 253, it is bonded to that layer.

For the first adhesive layer 254, a resin such as a curable resin that is curable at room temperature such as a two-component-mixture type resin, a light-curable resin, a heat-curable resin, or the like can be used. For example, an epoxy resin, an acrylic resin, a silicone resin, a phenol resin, and the like can be given. In particular, a material with low moisture permeability, such as an epoxy resin, is preferred. Note that in the case where the second element layer 256 contains a material which deteriorates when exposed to moisture or atmospheric air or the like, sealing can be performed with the first adhesive layer 254.

Figure 17C:
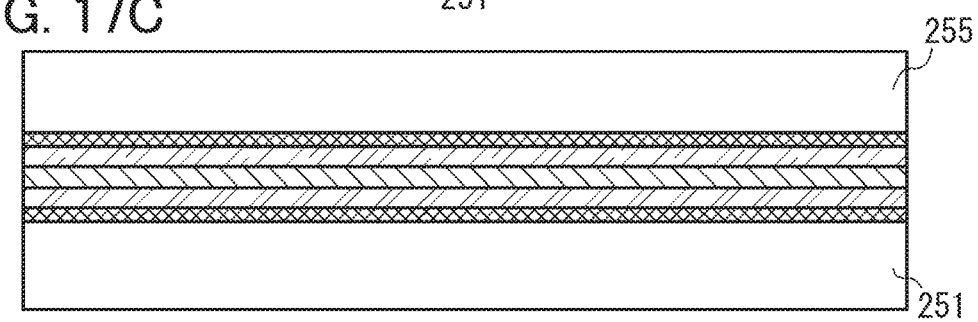

As a result, the first substrate 251 and the second substrate 255 are bonded to each other with the second element layer 256 interposed therebetween as illustrated in FIG. 17(C).

Figure 17D:
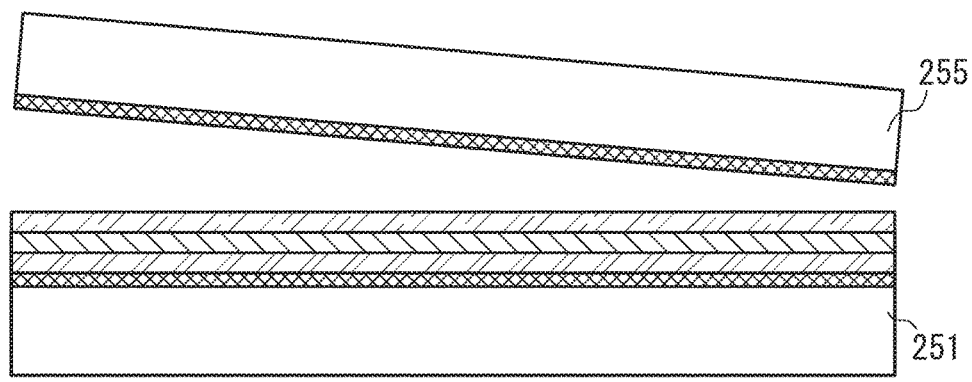

After that, the second substrate 255 is separated from the first substrate 251 at the second separation layer 257 as illustrated in FIG. 17(D) (first separation step).

A variety of methods can be used as appropriate for the separation step. For example, when a layer including a metal oxide film is formed as the second separation layer 257 on the side in contact with the second element layer 256, the metal oxide film is embrittled by crystallization, whereby the second element layer 256 can be separated from the second substrate 255. Alternatively, after part of the separation layer is further removed by etching using a solution or a fluoride gas such as $NF_3$, $BrF_3$, or $ClF_3$, the separation can be performed at the embrittled metal oxide film.

Alternatively, in the case where an amorphous silicon film containing hydrogen is formed as the second separation layer 257 between the second substrate 255 and the second element layer 256, the amorphous silicon film is removed by etching, whereby the second element layer 256 can be separated from the second substrate 255.

Furthermore, a method may be used in which a film containing nitrogen, oxygen, hydrogen, or the like (for example, an amorphous silicon film containing hydrogen, an alloy film containing hydrogen, an alloy film containing oxygen, or the like) is used as the second separation layer 257, and the second separation layer 257 is irradiated with laser light to release the nitrogen, oxygen, or hydrogen contained in the second separation layer 257 as a gas, thereby promoting separation between the second element layer 256 and the second substrate 255.

Alternatively, it is possible to use a method in which the second substrate 255 provided with the second element layer 256 is eliminated mechanically or removed by etching using a solution or a fluoride gas such as $NF_3$, $BrF_3$, or $ClF_3$, or the like. In this case, the second separation layer 257 is not necessarily provided.

Furthermore, the separation can be performed more easily by combination of the above-described separation methods. For example, separation can be performed with physical force by a machine or the like after the second separation layer 257 and the second element layer 256 are brought into the state allowing easy separation by performing laser light irradiation, etching on the second separation layer 257 with a gas, a solution, or the like, or mechanical elimination of the second separation layer 257 with a sharp knife, scalpel, or the like.

Alternatively, the second element layer 256 may be separated from the second substrate 255 in such a manner that a liquid permeates the interface between the second separation layer 257 and the second element layer 256. Furthermore, the separation may be performed while a liquid such as water is being poured.

As another separation method, in the case where the second separation layer 257 is formed using tungsten, it is preferable that the separation be performed while the second separation layer 257 is being etched using a mixed solution of ammonia water and a hydrogen peroxide solution.

Note that the second separation layer 257 is not necessarily provided in the case where separation at the interface between the second substrate 255 and the second element layer 256 is possible. For example, glass is used as the second substrate 255, an organic resin such as polyimide is formed in contact with the glass, and the second element layer 256 is formed over the organic resin. In this case, heating the organic resin enables the separation at the interface between the second substrate 255 and the organic resin. Alternatively, separation at the interface between a metal layer and the organic resin may be performed in the following manner: the metal layer is provided between the second substrate 255 and the organic resin and current is made to flow in the metal layer so that the metal layer is heated.

Figure 18A:
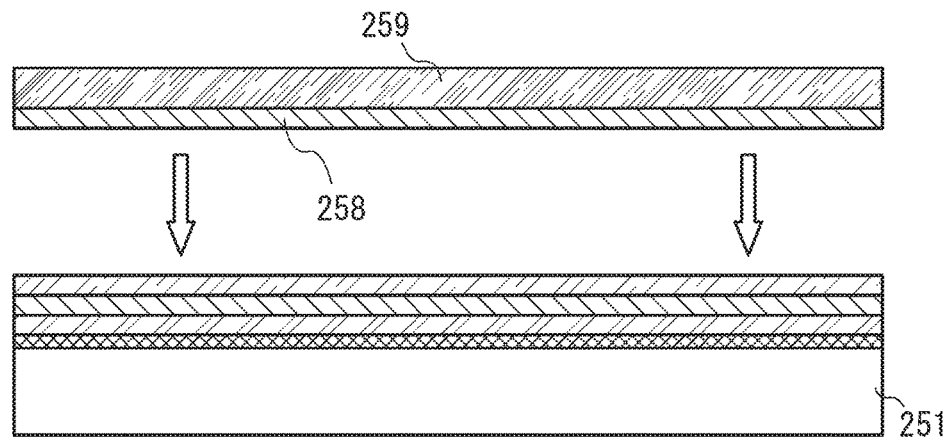
FIG. 18 Views illustrating an example of fabricating steps of an electronic device.

A second adhesive layer 258 is formed over one surface of a first flexible substrate 259 as illustrated in FIG. 18(A). In the meanwhile, after a surface of the second element layer 256 which has been separated from the second substrate 255 is cleaned to remove a residue of the second separation layer 257 or the like, the first flexible substrate 259 is bonded thereto. For the second adhesive layer 258, a material similar to that of the first adhesive layer 254 may be used. For the first flexible substrate 259, a variety of organic resin materials may be used.

Figure 18B:
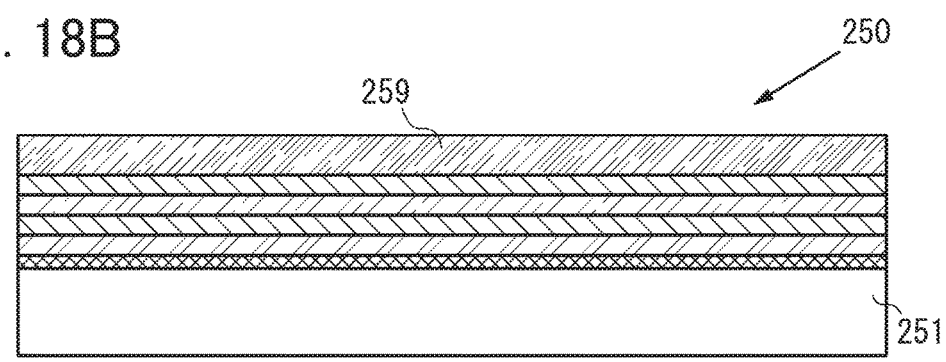

The first substrate 251 and the first flexible substrate 259 which are bonded to each other are referred to as a bonded substrate 250 (see FIG. 18(B)). The bonded substrate 250 includes the first substrate 251, the first separation layer 252, the first element layer 253, the first adhesive layer 254, the second element layer 256, the second adhesive layer 258, and the first flexible substrate 259.

Figure 18C:
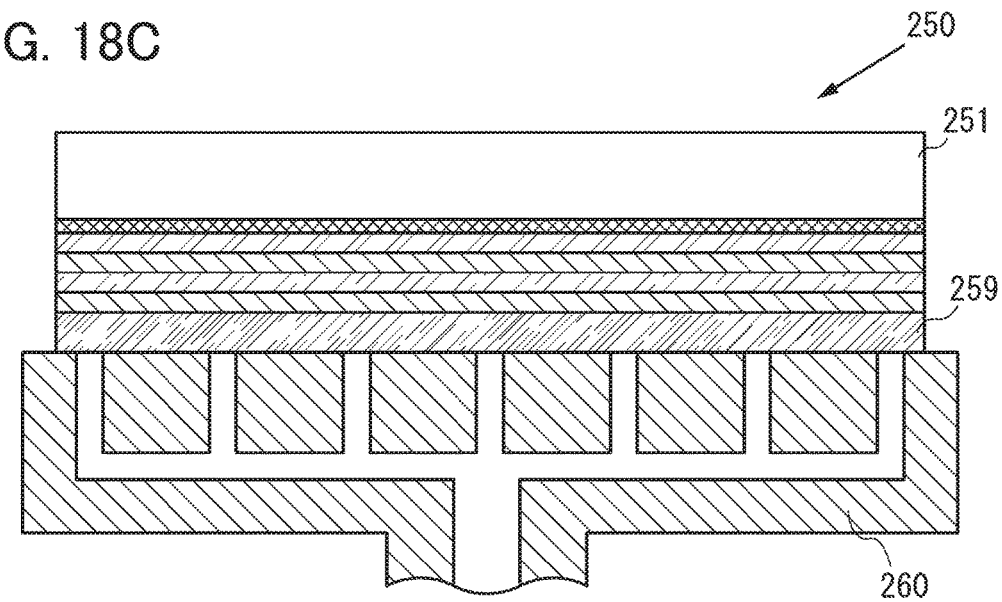

As illustrated in FIG. 18(C), the bonded substrate 250 is placed over a suction chuck 260 such that the first flexible substrate 259 is in contact with the suction chuck 260, and it is suction-fixed.

Figure 19A:
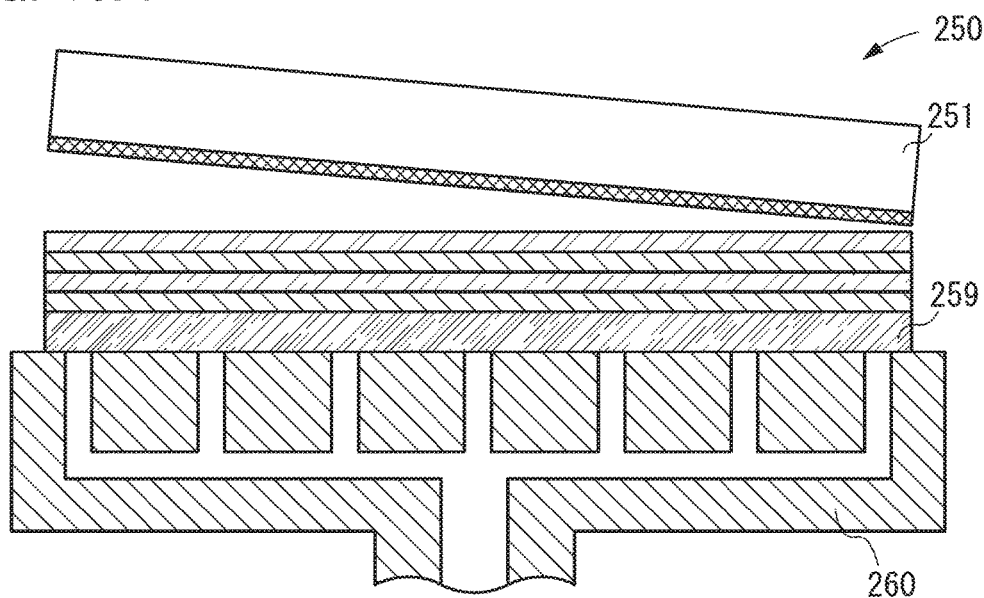
FIG. 19 Views illustrating an example of fabricating steps of an electronic device.

When one end of the first substrate 251 is lifted, the first substrate 251 and the first flexible substrate 259 are separated from each other around the first separation layer 252 as illustrated in FIG. 19(A) (second separation step).

Figure 19B:
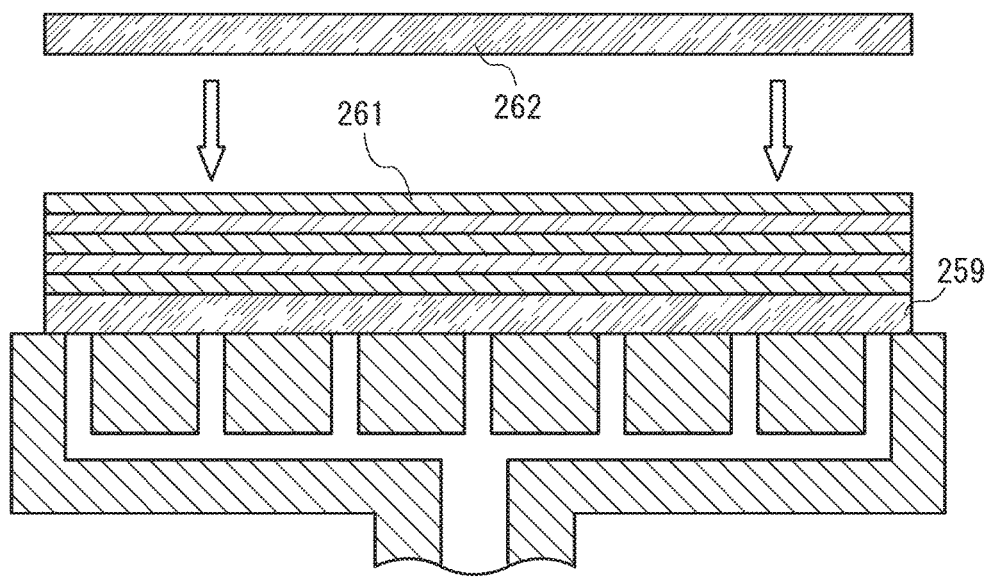
Figure 19C:
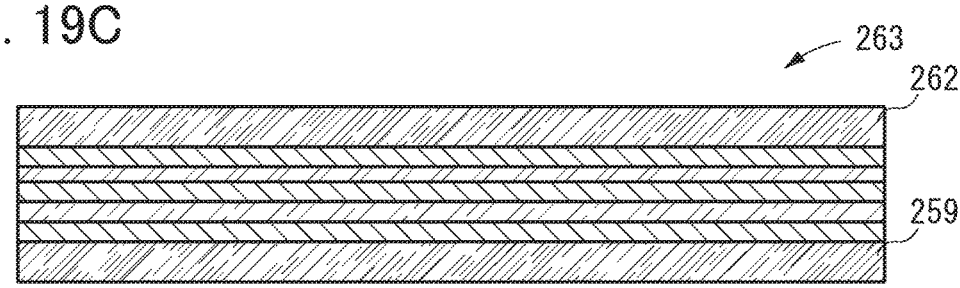

A residual of the first separation layer 252 is removed from a surface over the first element layer 253, and furthermore, a third adhesive layer 261 is formed over the first element layer 253. A material used for the third adhesive layer 261 may be the same as that of the first adhesive layer 254 or the second adhesive layer 258. Then, as illustrated in FIG. 19(B), a second flexible substrate 262 is bonded to the third adhesive layer 261. In such a manner, the first flexible substrate 259 and the second flexible substrate 262 are bonded to each other, thereby obtaining a flexible display substrate 263. Over the suction chuck 260, the flexible display substrate 263 may be equipped with a flexible printed circuit, an IC chip, or the like.

When the vacuum of the suction chuck 260 is released, a force to suction the flexible display substrate 263 is lost, and thus this can be taken out. After that, the flexible display substrate 263 may be subjected to further processing Since both the first flexible substrate 259 and the second flexible substrate 262 use flexible materials in the above example, defects of alignment or the like are likely to occur at the time of processing such as bonding. On the contrary, the above-described method, in which the second flexible substrate 262 is bonded to the first flexible substrate 259 which is being fixed over the suction chuck 260, can increase the alignment accuracy and can suppress the generation of defective devices. Note that vacuum suction is used in the above; however, another suction method may be used.

(Embodiment 3)

In this embodiment, structures of a flexible display substrate and a display element (a light-emitting element) which can be used for part of the electronic device described in Embodiment 1 or Embodiment 2 will be described with reference to FIG. 20 to FIG. 23.

Figure 20A:
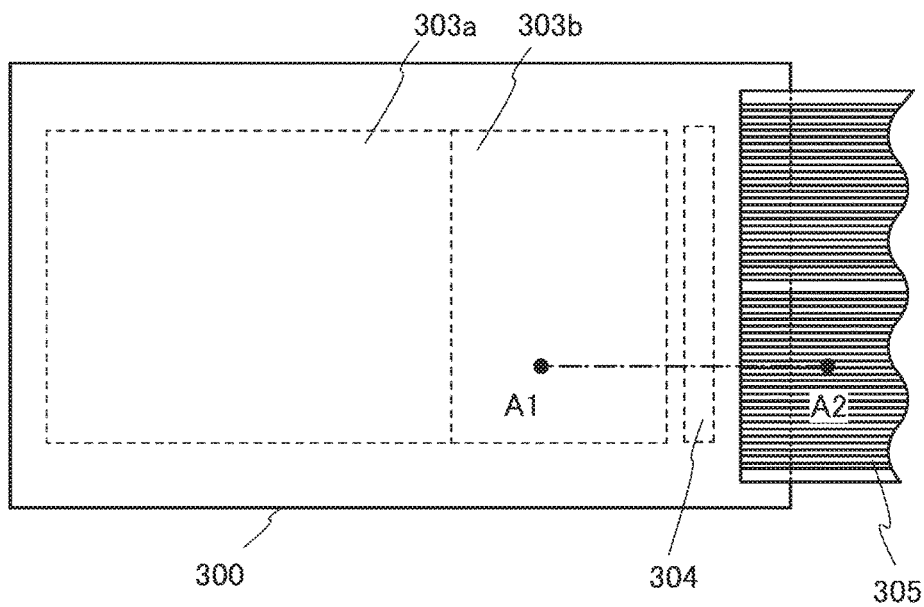
FIG. 20 Views illustrating a structure example of a flexible display substrate.
Figure 20B:
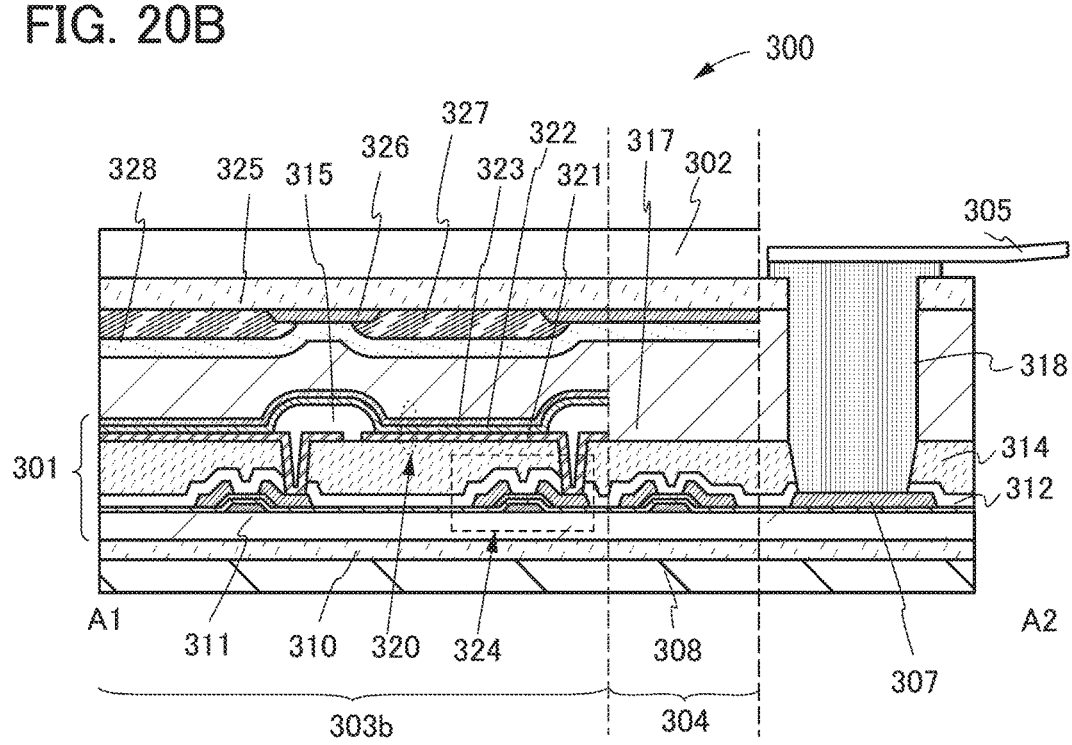

FIG. 20(A) illustrates a plan view of a flexible display substrate 300 device, and FIG. 20(B) illustrates one example of a schematic cross-sectional view taken along dashed-dotted line A1-A2 in FIG. 20(A). The flexible display substrate 300 includes a transmission-type display region 303a, a non-transmission-type display region 303b, and a driver circuit portion 304.

The flexible display substrate 300 illustrated in FIG. 20(B) includes an element layer 301, a flexible substrate 302, a flexible substrate 308, an adhesive layer 310, an adhesive layer 317, an adhesive layer 325, a light-blocking layer 326, a color filter 327, and an insulating layer 328 as illustrated in FIG. 20(B). The element layer 301 includes a conductive layer 307, an insulating layer 311, an insulating layer 312, an insulating layer 314, a partition wall 315, a plurality of light-emitting elements including a light-emitting element 320, and a plurality of transistors including a transistor 324.

The conductive layer 307 is electrically connected to a flexible printed circuit 305 through a connector 318.

The light-emitting element 320 includes a lower electrode 321, a light-emitting material layer 322, and an upper electrode 323. The lower electrode 321 is electrically connected to a source electrode or a drain electrode of the transistor 324. An end portion of the lower electrode 321 is covered with the partition wall 315. The light-emitting element 320 has a structure for a top-emission display method. The upper electrode 323 has a light-transmitting property and transmits light emitted from the light-emitting material layer 322.

The color filter 327 is provided at a position overlapping with the light-emitting element 320, and the light-blocking layer 326 is provided at a position overlapping with the partition wall 315. The color filter 327 and the light-blocking layer 326 are covered with the insulating layer 328. The space between the light-emitting element 320 and the insulating layer 328 is filled with the adhesive layer 317.

The flexible display substrate 300 includes a plurality of transistors in the driver circuit portion 304. The transistors are provided over the insulating layer 311. The insulating layer 311 and the flexible substrate 308 are bonded with the adhesive layer 310. It is preferable to use materials with low water permeability for the insulating layer 311 and the adhesive layer 325, in which case an impurity such as water can be prevented from entering the light-emitting element 320 or the transistor 324, leading to improved reliability of the flexible display substrate.

An example of a method for fabricating a flexible display substrate will be described below. The insulating layer 311, the transistor 324, and the light-emitting element 320 are formed over a formation substrate with high heat resistance (a first formation substrate), and the color filter 327 and the light-blocking layer 326 are formed over another formation substrate with high heat resistance (a second formation substrate). Then, after the first formation substrate and the second formation substrate are bonded using the adhesive layer 317, the first formation substrate is peeled out. With the use of the adhesive layer 310, the flexible substrate 308 is bonded over the insulating layer 311, the transistor 324, and the light-emitting element 320. In addition, the second formation substrate is peeled out, and the flexible substrate 302 is bonded over the color filter 327 and the light-blocking layer 326 with the use of the adhesive layer 325. In this manner, the flexible display substrate can be fabricated.

In the case where a material with high water permeability and low heat resistance (resin and the like) is used for a flexible substrate, it is impossible to expose the substrate to high temperatures in the fabricating process. Thus, there is a limitation on conditions for forming a transistor and an insulating film over the substrate. In the fabricating method of this embodiment, a transistor and the like can be formed because the formation substrate with high heat resistance, though inflexible, has sufficiently high heat-resistant; thus, a highly reliable transistor and an insulating film with sufficiently low water permeability can be formed. Then, these are bonded to the flexible substrate 308 and thus a highly reliable flexible display substrate can be fabricated. In this manner, a thin or lightweight flexible display substrate with high reliability can be provided.

The flexible substrate 302 and the flexible substrate 308 are each preferably formed using a material with high toughness. Thus, a display device with high impact resistance that is unlikely to be broken can be provided. For example, when the flexible substrate 302 is an organic resin substrate and the flexible substrate 308 is a substrate using a thin metal material or alloy material, the flexible display substrate can be more lightweight and less likely to be broken than the case where a glass substrate is used for the substrate.

A metal material and an alloy material, which have high thermal conductivity, are preferred because they can easily conduct heat to the whole substrate and accordingly can prevent a local temperature rise in the flexible display substrate. The thickness of a substrate using a metal material or an alloy material is preferably greater than or equal to 10 µm and less than or equal to 200 µm, further preferably greater than or equal to 20 µm and less than or equal to 50 µm.

Furthermore, when a material with high thermal emissivity is used for the flexible substrate 308, the surface or internal temperature of the flexible display substrate can be prevented from rising, leading to prevention of breakage or a decrease in reliability of the flexible display substrate. For example, the flexible substrate 308 may have a stacked structure of a metal substrate and a layer with high thermal emissivity (a metal oxide or a ceramic material can be used, for example).

Figure 21A:
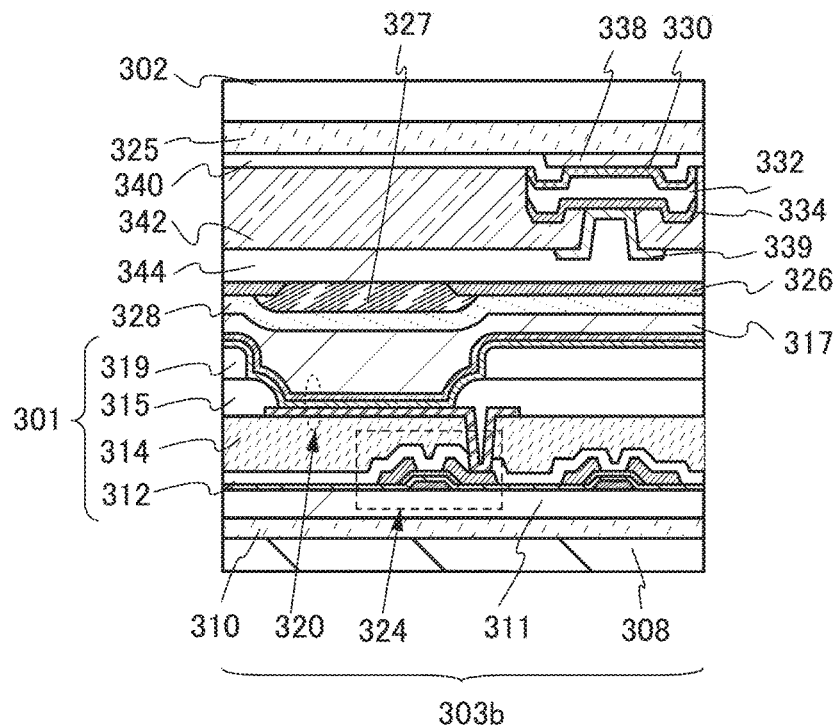
FIG. 21 Views illustrating structure examples of a flexible display substrate.

In FIG. 21(A), a different example of the non-transmission-type display region 303b in the flexible display substrate is illustrated. The flexible display substrate of FIG. 21(A) is a light-emitting device capable of touch operation. Note that, in each of the following examples, description of components similar to those in the above example is omitted.

The flexible display substrate illustrated in FIG. 21(A) includes the element layer 301, the flexible substrate 302, the flexible substrate 308, the adhesive layer 310, the adhesive layer 317, the adhesive layer 325, the light-blocking layer 326, the color filter 327, the insulating layer 328, a plurality of light-receiving elements, a conductive layer 338, a conductive layer 339, an insulating layer 340, an insulating layer 342, and an insulating layer 344. The element layer 301 includes the insulating layer 311, the insulating layer 312, the insulating layer 314, a partition wall 315, a spacer 319, a plurality of light-emitting elements including the light-emitting element 320, and a plurality of transistors including the transistor 324.

Here, the spacer 319 is included over the partition wall 315. The space between the flexible substrate 302 and the flexible substrate 308 can be adjusted by provision of the spacer 319.

FIG. 21(A) illustrates an example in which a light-receiving element is provided between the adhesive layer 325 and the adhesive layer 317. Since the light-receiving element can be placed to overlap with a non-light-emitting region on the flexible substrate 308 side (e.g., a region where the transistor 324 or a wiring is provided), the flexible display substrate can be provided with a touch sensor without a decrease in the aperture ratio of a pixel (light-emitting element).

As the light-receiving element included in the flexible display substrate, for example, a pn-type or pin-type photodiode can be used. In this embodiment, a pin-type photodiode including a p-type semiconductor layer 330, an i-type semiconductor layer 332, and an n-type semiconductor layer 334 is used as the light-receiving element.

Note that the concentration of each of an impurity imparting p-type and an impurity imparting n-type contained in the i-type semiconductor layer 332 is $1 \times 10^{20}$ cm$^{-3}$ or less and photoconductivity is 100 times or more as high as dark conductivity. The i-type semiconductor layer 332 also includes, in its category, one that contains an impurity element belonging to Group 13 or Group 15 of the periodic table. In other words, since an i-type semiconductor has weak n-type electric conductivity when an impurity element for controlling valence electrons is intentionally not added, the i-type semiconductor layer 332 includes, in its category, one to which an impurity element imparting p-type is added intentionally or unintentionally at the time of deposition or after the deposition.

The light-blocking layer 326 overlaps with the light-receiving element on the surface side closer to the flexible substrate 302. The light-blocking layer 326 placed between the light-receiving element and the adhesive layer 317 can prevent the light-receiving element from being irradiated with light emitted from the light-emitting element 320.

The conductive layer 338 and the conductive layer 339 each are electrically connected to the light-receiving element. As the conductive layer 338, a conductive layer which transmits light incident on the light-receiving element is preferably used. As the conductive layer 339, a conductive layer which blocks light incident on the light-receiving element is preferably used.

It is preferable to provide an optical touch sensor between the flexible substrate 302 and the adhesive layer 317 because it is less likely to be affected by light emitted from the light-emitting element 320 and can have an improved S/N ratio.

Figure 21B:
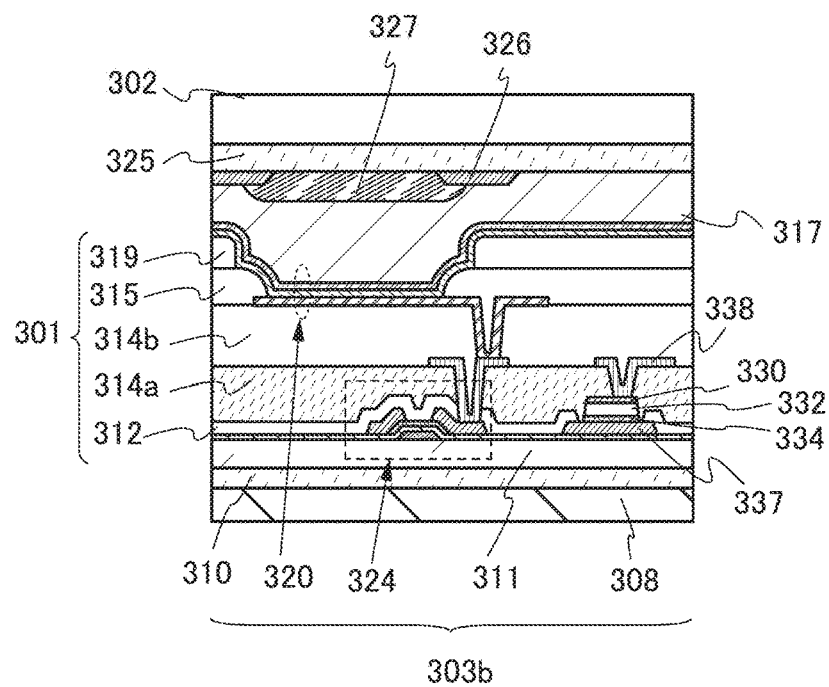

In FIG. 21(B), a different example of the non-transmission-type display region 303b in this flexible display substrate is illustrated. The flexible display substrate of FIG. 21(B) is a light-emitting device capable of touch operation.

The flexible display substrate illustrated in FIG. 21(B) includes the element layer 301, the flexible substrate 302, the flexible substrate 308, the adhesive layer 310, the adhesive layer 317, the adhesive layer 325, the light-blocking layer 326, and the color filter 327. The element layer 301 includes the insulating layer 311, the insulating layer 312, the insulating layer 314a, the insulating layer 314b, the partition wall 315, the spacer 319, a plurality of light-emitting elements including the light-emitting element 320, a plurality of transistors including the transistor 324, a plurality of light-receiving elements, a conductive layer 337, and a conductive layer 338.

FIG. 21(B) illustrates an example in which a light-receiving element is provided between the insulating layer 311 and the adhesive layer 317. The light-receiving element is provided between the insulating layer 311 and the adhesive layer 317, whereby a conductive layer to which the light-receiving element is electrically connected and a photoelectric conversion layer included in the light-receiving element can be formed using the same materials and the same steps as a conductive layer and a semiconductor layer included in the transistor 324. Thus, the flexible display substrate capable of touch operation can be formed without a significant increase in the number of fabricating steps.

Figure 22A:
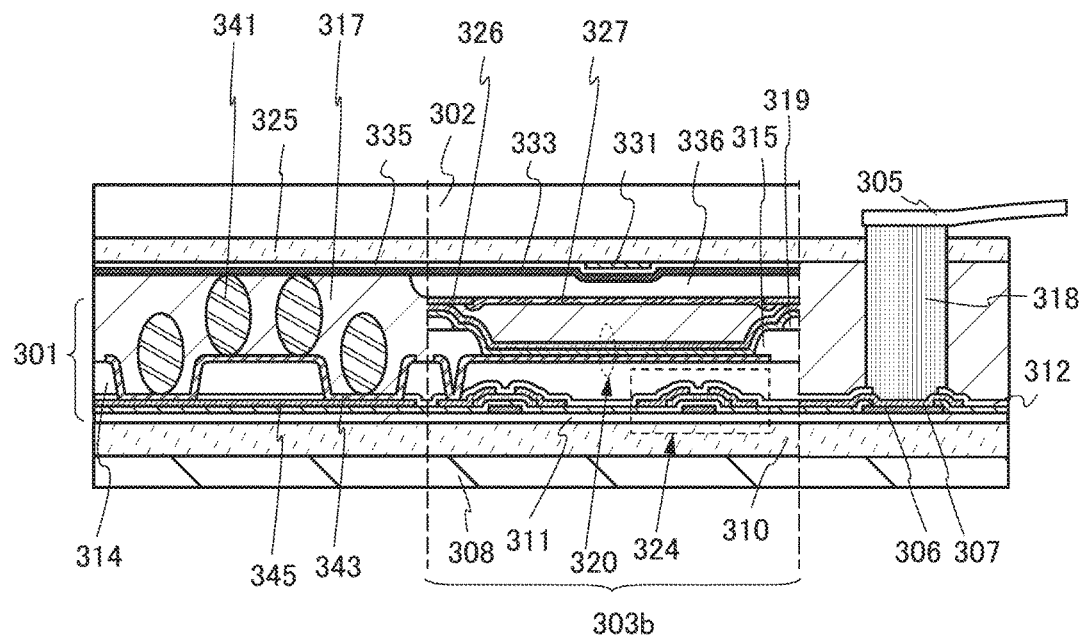
FIG. 22 Views illustrating structure examples of a flexible display substrate.

In FIG. 22(A), a different example of a flexible display substrate is illustrated. The flexible display substrate of FIG. 22(A) is a light-emitting device capable of touch operation.

The flexible display substrate illustrated in FIG. 22(A) includes the element layer 301, the flexible substrate 302, the flexible substrate 308, the adhesive layer 310, the adhesive layer 317, the adhesive layer 325, the light-blocking layer 326, the color filter 327, a conductive layer 331, a conductive layer 333, an insulating layer 335, and an insulating layer 336. The element layer 301 includes the conductive layer 306, the conductive layer 307, the insulating layer 311, the insulating layer 312, the insulating layer 314, the partition wall 315, the spacer 319, a plurality of light-emitting elements including the light-emitting element 320, a plurality of transistors including the transistor 324, a conductive layer 343, and a conductive layer 345.

FIG. 22(A) illustrates an example in which a capacitive touch sensor is provided between the adhesive layer 325 and the adhesive layer 317. The capacitive touch sensor includes the conductive layer 331 and the conductive layer 333.

The conductive layer 306 and the conductive layer 307 are electrically connected to the flexible printed circuit 305 through the connector 318. The conductive layer 343 and the conductive layer 345 are electrically connected to the conductive layer 333 through conductive particles 341. Thus, the capacitive touch sensor can be driven via the flexible printed circuit 305.

Figure 22B:
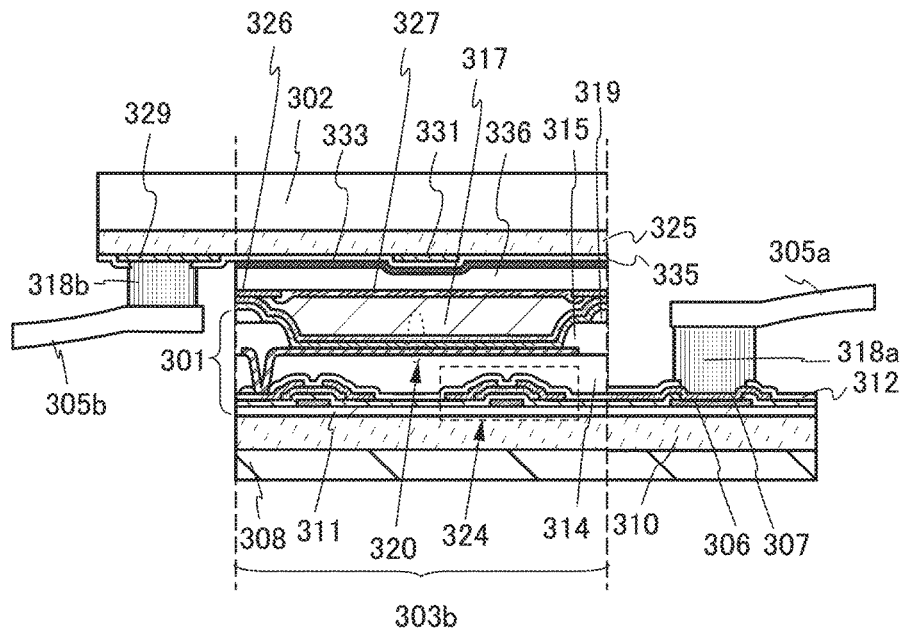

In FIG. 22(B), a different example of a flexible display substrate is illustrated. The flexible display substrate of FIG. 22(B) is a light-emitting device capable of touch operation.

The flexible display substrate illustrated in FIG. 22(B) includes the element layer 301, the flexible substrate 302, the flexible substrate 308, the adhesive layer 310, the adhesive layer 317, the adhesive layer 325, the light-blocking layer 326, the color filter 327, a conductive layer 329, the conductive layer 331, the conductive layer 333, the insulating layer 335, and the insulating layer 336. The element layer 301 includes the conductive layer 306, the conductive layer 307, the insulating layer 311, the insulating layer 312, the insulating layer 314, the partition wall 315, the spacer 319, a plurality of light-emitting elements including the light-emitting element 320, and a plurality of transistors including the transistor 324.

FIG. 22(B) illustrates an example in which a capacitive touch sensor is provided between the adhesive layer 325 and the adhesive layer 317. The capacitive touch sensor includes the conductive layer 331 and the conductive layer 333.

The conductive layer 306 and the conductive layer 307 are electrically connected to a flexible printed circuit 305*a* through a connector 318*a*. The conductive layer 329 is electrically connected to a flexible printed circuit 305*b* through a connector 318*b*. Thus, the light-emitting element 320 and the transistor 324 can be driven via the flexible printed circuit 305*a*, and the capacitive touch sensor can be driven via the flexible printed circuit 305*b*.

Figure 23A:
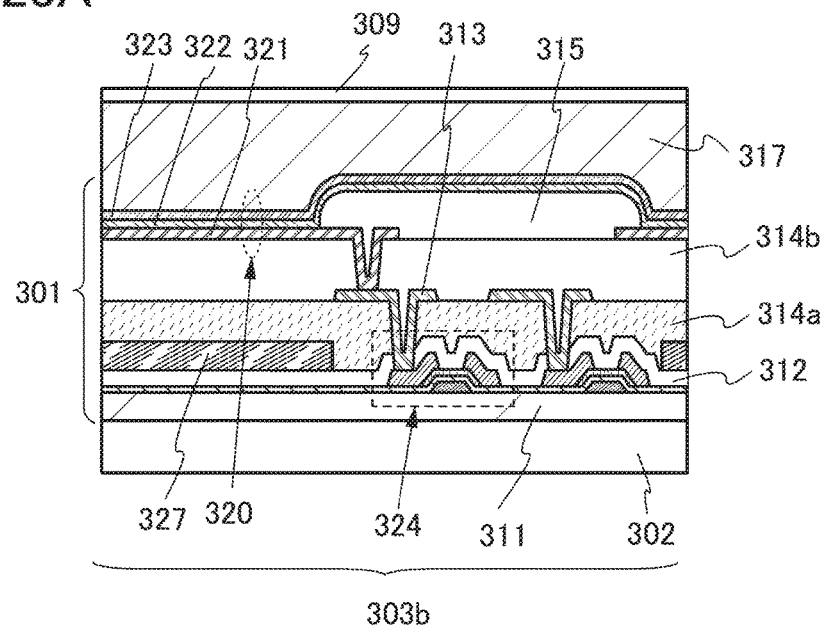
FIG. 23 Views illustrating structure examples of a flexible display substrate.

In FIG. 23(A), a different example of the non-transmission-type display region 303*b* in the flexible display substrate is illustrated.

The non-transmission-type display region 303*b* illustrated in FIG. 23(A) includes the element layer 301, the flexible substrate 302, a flexible substrate 309, and the adhesive layer 317. The element layer 301 includes the insulating layer 311, the insulating layer 312, a conductive layer 313, the insulating layer 314*a*, the insulating layer 314*b*, the partition wall 315, a plurality of light-emitting elements including the light-emitting element 320, a plurality of transistors including the transistor 324, and the color filter 327.

The light-emitting element 320 includes the lower electrode 321, the light-emitting material layer 322, and the upper electrode 323. The lower electrode 321 is electrically connected to the source electrode or the drain electrode of the transistor 324 through the conductive layer 313. An end portion of the lower electrode 321 is covered with the partition wall 315. The light-emitting element 320 has a structure for a bottom-emission display method. The lower electrode 321 has a light-transmitting property and transmits light emitted from the light-emitting material layer 322.

The color filter 327 is provided at a position overlapping with the light-emitting element 320, and light emitted from the light-emitting element 320 is extracted from the flexible substrate 302 side through the color filter 327. The space between the light-emitting element 320 and the flexible substrate 309 is filled with the adhesive layer 317. The flexible substrate 309 can be formed using a material similar to that of the flexible substrate 308 described above.

Figure 23B:
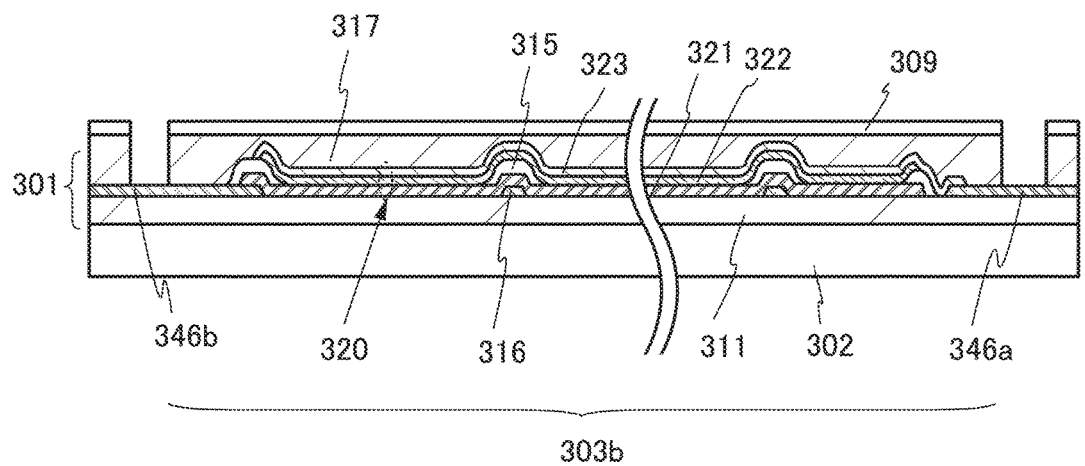

The flexible display substrate illustrated in FIG. 23(B) includes the element layer 301, the flexible substrate 302, the flexible substrate 309, and the adhesive layer 317. The element layer 301 includes the insulating layer 311, the partition wall 315, the conductive layer 316, a plurality of light-emitting elements including the light-emitting element 320, a conductive layer 346*a*, and a conductive layer 346*b*.

The conductive layer 346*a* and the conductive layer 346*b*, which are external connection electrodes of the flexible display substrate, can be electrically connected to a flexible printed circuit or the like.

The light-emitting element 320 includes the lower electrode 321, the light-emitting material layer 322, and the upper electrode 323. An end portion of the lower electrode 321 is covered with the partition wall 315. The light-emitting element 320 has a structure for a bottom-emission display method. The lower electrode 321 has a light-transmitting property and transmits light emitted from the light-emitting material layer 322. The conductive layer 316 is electrically connected to the lower electrode 321.

A hemispherical lens, a micro lens array, a film provided with an uneven structure, a light diffusing film, or the like may be bonded to the flexible substrate 302 as a light extraction structure. For example, a light extraction structure can be formed by adhering the above lens or film to the flexible substrate 302 with the use of an adhesive or the like which has substantially the same refractive index as the flexible substrate 302 or the above lens or film.

The conductive layer 316 is preferably, though not necessarily, provided because voltage drop due to the resistance of the lower electrode 321 can be prevented. In addition, for a similar purpose, a conductive layer electrically connected to the upper electrode 323 can be provided over the partition wall 315.

The conductive layer 316 can be formed as a single layer or a stacked layer using a material selected from copper, titanium, tantalum, tungsten, molybdenum, chromium, neodymium, scandium, nickel, or aluminum; or an alloy material containing these materials as its main component. The thickness of the conductive layer 316 can be greater than or equal to 0.1 µm and less than or equal to 3 µm, typically greater than or equal to 0.1 µm and less than or equal to 0.5 µm.

When a paste (a silver paste or the like) is used as a material for the conductive layer electrically connected to the upper electrode 323, particles of the metal from which the conductive layer is formed aggregate; therefore, the surface of the conductive layer is rough and has many gaps. Thus, it is difficult for the light-emitting material layer 322 to completely cover the conductive layer; accordingly, the upper electrode and the conductive layer are electrically connected to each other easily, which is preferable.

Next, a material and the like that can be used for the flexible display substrate will be described. Description on the flexible substrate 302, the flexible substrate 308, the flexible substrate 309, the adhesive layer 310, the adhesive layer 317, and the adhesive layer 325 is omitted because the description on the first flexible substrate 259, the second flexible substrate 262, the first adhesive layer 254, the second adhesive layer 258, the third adhesive layer 261, and the like in Embodiment 2 can be referred to.

The structure of the transistors included in the flexible display substrate is not particularly limited. For example, a staggered-type transistor or an inverted staggered-type transistor may be used. Furthermore, any transistor structure of a top-gate type and a bottom-gate type may be used. A semiconductor material used for the transistors is not particularly limited, and for example, silicon, germanium, or the like can be given. Alternatively, an oxide semiconductor containing at least one of indium, gallium, and zinc, such as an In—Ga—Zn-based metal oxide, may be used.

The crystallinity of a semiconductor material used for the transistors is also not particularly limited, and any of an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

The light-emitting element included in the flexible display substrate includes the lower electrode 321, the upper electrode 323, and the light-emitting material layer 322 provided therebetween. One of the lower electrode 321 and the upper electrode 323 functions as an anode and the other functions as a cathode.

The light-emitting element emits light by any method of a top-emission display method, a bottom-emission display method, and a dual-emission display method. A conductive film that transmits visible light is used as the electrode on the side through which light is extracted. In addition, a conductive film that reflects visible light is preferably used as the electrode on the side through which light is not extracted. For example, a light-emitting element that emits light by a dual-emission display method may be provided in the transmission-type display region 303a in the flexible display substrate 300 of FIG. 20 (A), and a light-emitting element that emits light by a top-emission display method or a bottom-emission display method may be provided in the non-transmission-type display region 303b.

The conductive film that transmits visible light can be formed using, for example, indium oxide, indium tin oxide (ITO: Indium Tin Oxide), indium zinc oxide, zinc oxide, zinc oxide to which gallium is added, or the like. Alternatively, a metal material such as gold, silver, platinum, magnesium, nickel, tungsten, chromium, molybdenum, iron, cobalt, copper, palladium, or titanium; an alloy containing these metal materials; a nitride of these metal materials (e.g., titanium nitride), or the like can also be used when formed thin to the degree of having a light-transmitting property. Alternatively, a stacked film of the above materials can be used as the conductive layer. For example, a stacked film of ITO and an alloy of silver and magnesium or the like is preferably used, in which case conductivity can be increased. Alternatively, graphene or the like may be used.

For the conductive film that reflects visible light, for example, a metal material such as aluminum, gold, platinum, silver, nickel, tungsten, chromium, molybdenum, iron, cobalt, copper, or palladium, or an alloy containing these metal materials can be used. Alternatively, lanthanum, neodymium, germanium, or the like may be added to the above metal materials or alloy. Alternatively, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, palladium, and copper, or an alloy of silver and magnesium can be used for formation. An alloy of silver and copper is preferable because of its high heat resistance. Moreover, a metal film or a metal oxide film is stacked on an aluminum alloy film, whereby oxidation of the aluminum alloy film can be suppressed. As a material for the metal film or the metal oxide film, titanium, titanium oxide, and the like can be given. Alternatively, the conductive film that transmits visible light and a film containing the metal materials may be stacked. For example, a stacked film of silver and ITO, a stacked film of an alloy of silver and magnesium and ITO, or the like can be used.

Each of the electrodes may be formed by an evaporation method or a sputtering method. In addition, it can be formed by a discharging method such as an ink-jet method, a printing method such as a screen printing method, or a plating method.

When a voltage higher than the threshold voltage of the light-emitting element is applied between the lower electrode 321 and the upper electrode 323, holes are injected to the light-emitting material layer 322 from the anode side and electrons are injected from the cathode side. The injected electrons and holes are recombined in the light-emitting material layer 322 and a light-emitting substance contained in the light-emitting material layer 322 emits light.

The light-emitting material layer 322 includes at least a light-emitting layer. As a layer other than the light-emitting layer, the light-emitting material layer 322 may further include a layer containing a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), and the like.

For the light-emitting material layer 322, either a low molecular compound or a high molecular compound can be used, and an inorganic compound may also be included. Each of the layers included in the light-emitting material layer 322 can be formed by an evaporation method (including a vacuum evaporation method), a transfer method, a printing method, an inkjet method, a coating method, and the like.

For the insulating layer 311 and the insulating layer 312, an inorganic insulating material can be used. It is particularly preferable to use the aforementioned insulating film with low water permeability, in which case a highly reliable flexible display substrate can be provided.

The insulating layer 312 has an effect of preventing diffusion of impurities into a semiconductor included in the transistor. As the insulating layer 312, an inorganic insulating film such as a silicon oxide film, a silicon oxynitride film, or an aluminum oxide film can be used.

As each of the insulating layer 314, the insulating layer 314a, and the insulating layer 314b, an insulating film with a planarization function is preferably selected in order to reduce surface unevenness due to the transistor or the like. For example, an organic material such as polyimide, acrylic, or a benzocyclobutene-based resin can be used. Other than the above organic materials, it is also possible to use a low-dielectric constant material (a low-k material) or the like. Note that a plurality of insulating films formed of these materials or inorganic insulating films may be stacked.

The partition wall 315 is provided to cover an end portion of the lower electrode 321. In order to make the coverage with the light-emitting material layer 322 and the upper electrode 323 formed over the partition wall 315 favorable, a side wall of the partition wall 315 preferably has a tilted surface with continuous curvature.

As a material for the partition wall 315, a resin or an inorganic insulating material can be used. As the resin, for example, a polyimide resin, a polyamide resin, an acrylic resin, a siloxane resin, an epoxy resin, a phenol resin, or the like can be used. In particular, a negative photosensitive resin or a positive photosensitive resin is preferably used because formation of the partition wall 315 becomes easy.

Although the method for forming the partition wall 315 is not particularly limited, a photolithography method, a sputtering method, an evaporation method, a droplet discharging method (an inkjet method or the like), a printing method (a screen printing method, an off-set printing method, or the like), or the like can be used.

The spacer 319 can be formed using an inorganic insulating material, an organic insulating material, a metal material, or the like. As the organic insulating material, for example, a negative or positive photosensitive resin, a non-photosensitive resin, or the like can be used. In addition, as the metal material, titanium, aluminum, or the like can be used. A structure in which a conductive material is used for the spacer 319 and the spacer 319 and the upper electrode 323 are electrically connected to each other can prevent voltage drop due to the resistance of the upper electrode 323. In addition, the spacer 319 may have either a tapered shape or an inverse tapered shape.

Each of the insulating layer 335, the insulating layer 336, the insulating layer 340, the insulating layer 342, and the insulating layer 344 can be formed using an inorganic insulating material or an organic insulating material. It is particularly preferable to use an insulating layer with a planarization function for the insulating layer 336 and the insulating layer 344 in order to reduce surface unevenness due to a sensor element.

For the adhesive layer 317, a resin such as a curable resin that is curable at room temperature such as a two-component-mixture-type resin, a light curable resin, a heat-curable resin, or the like can be used. For example, a PVC (polyvinyl chloride) resin, an acrylic resin, a polyimide resin, an epoxy resin, a silicone resin, a PVB (polyvinyl butyral) resin, an EVA (ethylene vinyl acetate) resin, or the like can be used. A drying agent may be contained in the adhesive layer 317. In addition, in the case where light of the light-emitting element 320 is extracted outside the light-emitting device through the adhesive layer 317, the adhesive layer 317 preferably includes a filler with a high refractive index or a scattering member. As for the drying agent, the filler with a high refractive index, and the scattering member, materials similar to the materials that can be used for the adhesive layer 310 can be given.

Each of the conductive layer 306, the conductive layer 307, the conductive layer 343, and the conductive layer 345 can be formed using the same material and the same step as a conductive layer included in the transistor or the light-emitting element. In addition, the conductive layer 337 can be formed using the same material and the same step as a conductive layer included in the transistor.

For example, the conductive layers can be formed as a single layer or a stacked layer using metal materials such as molybdenum, titanium, chromium, tantalum, tungsten, aluminum, copper, neodymium, and scandium, and an alloy material containing these elements. Each of the conductive layers may be formed using a conductive metal oxide. As the conductive metal oxide, indium oxide ($In_2O_3$, or the like), tin oxide ($SnO_2$, or the like), zinc oxide (ZnO), ITO, indium zinc oxide ($In_2O_3$—ZnO, or the like), or these metal oxide materials in which silicon oxide is contained can be used.

Each of the conductive layer 313, the conductive layer 316, the conductive layer 346a, and the conductive layer 346b can also be formed using the above metal materials, alloy materials, conductive metal oxides, and the like.

The conductive layer 331 and the conductive layer 333, and the conductive layer 338 and the conductive layer 339 are conductive layers with a light-transmitting property. For example, indium oxide, ITO, indium zinc oxide, zinc oxide, zinc oxide to which gallium is added, or the like can be used. In addition, the conductive layer 329 can be formed using the same material and the same step as the conductive layer 331.

As the conductive particles 341, particles of an organic resin, silica, or the like whose structure is coated with a metal material are used. It is preferable to use nickel or gold as the metal material because contact resistance can be reduced. It is also preferable to use particles coated with layers of two or more kinds of metal materials like nickel further coated with gold.

For the connector 318, it is possible to use a paste-like or sheet-like material in which metal particles are mixed with a heat-curable resin and which exhibits anisotropic conductivity by thermocompression bonding. As the metal particles, particles in which two or more kinds of metals are layered, for example, nickel particles coated with gold or the like are preferably used.

The color filter 327 is a colored layer that transmits light in a specific wavelength range. For example, a red (R) color filter that transmits light in a red wavelength range, a green (G) color filter that transmits light in a green wavelength range, a blue (B) color filter that transmits light in a blue wavelength range, or the like can be used. Each color filter is formed in a desired position with various materials by a printing method, an inkjet method, an etching method using a photolithography method, or the like.

The light-blocking layer 326 is provided between the adjacent color filters 327. The light-blocking layer 326 blocks light emitted from the adjacent light-emitting element, thereby preventing color mixture between adjacent pixels. Here, an end portion of the color filter 327 is provided to overlap with the light-blocking layer 326, whereby light leakage can be prevented. The light-blocking layer 326 can be formed using a material that blocks light of the light-emitting element, and it can be formed using a metal material, a resin material including a pigment or a dye, or the like. Note that, as illustrated in FIG. 20(A), the light-blocking layer 326 is preferably provided also in a region other than the transmission-type display region 303a or the non-transmission-type display region 303b, such as the driver circuit portion 304, in which case undesired light leakage due to guided wave light or the like can be prevented.

In addition, the insulating layer 328 covering the color filter 327 and the light-blocking layer 326 is preferably provided because it can prevent an impurity such as a pigment included in the color filter 327 or the light-blocking layer 326 from diffusing into the light-emitting element or the like. For the insulating layer 328, a light-transmitting material is used, and an inorganic insulating material or an organic insulating material can be used. The aforementioned insulating film with low water permeability may be used for the insulating layer 328.

This embodiment can be combined with the other embodiments as appropriate.

REFERENCE NUMERALS

100a: display device, 100b: display device, 101: flexible display substrate, 102: flexible printed circuit, 103: IC chip, 103a: IC chip, 103b: IC chip, 103c: IC chip, 103d: IC chip, 104: non-transmission-type display region, 104a: non-transmission-type display region, 104b: non-transmission-type display region, 105: transmission-type display region, 110a: electronic device, 110b: electronic device, 110c: electronic device, 110d: electronic device, 110e: electronic device, 110f: electronic device, 111: housing, 111a: first housing, 111b: second housing, 111c: first housing, 111d: second housing, 111e: first housing, 111f: second housing, 111g: third housing, 111h: fourth housing, 111i: fifth housing, 111j: sixth housing, 112: opening, 113: operation button, 115: battery, 116: transparent filler, 117: board, 117a: board, 117b: board, 118: electronic component, 119: axis, 120: stopper, 121a: axis support portion, 121b: axis support portion, 122a: flexible substrate, 122b: flexible substrate, 123: opening, 124a: side frame member, 124b: side frame member, 125: control unit, 126: frame, 200: display device, 201: flexible substrate, 202: pixel, 203: transistor, 203a: transistor, 204: reflective layer, 205: insulating layer, 206: transparent electrode, 207: partition wall, 208: light-emitting material layer, 209: electrode layer, 210: flexible substrate, 211: light-blocking layer, 212: color filter, 213: adhesive layer, 214: reflective electrode, 215: gate wiring, 216: insulating layer, 217: semiconductor layer, 218: electrode, 219: electrode, 220: second gate wiring, 221: flexible substrate, 222: transistor, 223: insulating layer, 224: reflective layer, 225: insulating layer, 226: transparent electrode, 227: partition wall, 228: light-emitting material layer, 229: electrode layer, 230: gate wiring, 231: insulating layer, 232: semiconductor layer, 233: electrode, 234: electrode, 250: bonded substrate, 251: first substrate, 252: first separation layer, 253: first element layer, 254: first adhesive layer, 255: second substrate, 256: second element layer, 257: second separation layer, 258: second adhesive layer, 259: first flexible substrate, 260: suction chuck, 261: third adhesive layer, 262: second flexible substrate, 263: flexible display substrate, 300: flexible display substrate, 301: element layer, 302: flexible substrate, 303a: transmission-type display region, 303b: non-transmission-type display region, 304: driver circuit portion, 305: flexible printed circuit, 305a: flexible printed circuit, 305b: flexible printed circuit, 306: conductive layer, 307: conductive layer, 308: flexible substrate, 309: flexible substrate, 310: adhesive layer, 311: insulating layer, 312: insulating layer, 313: conductive layer, 314: insulating layer, 314a: insulating layer, 314b: insulating layer, 315: partition wall, 316: conductive layer, 317: adhesive layer, 318: connector, 318a: connector, 318b: connector, 319: spacer, 320: light-emitting element, 321: lower electrode, 322: light-emitting material layer, 323: upper electrode, 324: transistor, 325: adhesive layer, 326: light-blocking layer, 327: color filter, 328: insulating layer, 329: conductive layer, 330: p-type semiconductor layer, 331: conductive layer, 332: i-type semiconductor layer, 333: conductive layer, 334: n-type semiconductor layer, 335: insulating layer, 336: insulating layer, 337: conductive layer, 338: conductive layer, 339: conductive layer, 340: insulating layer, 341: conductive particle, 342: insulating layer, 343: conductive layer, 344: insulating layer, 345: conductive layer, 346a: conductive layer, 346b: conductive layer

The invention claimed is:

1. An electronic device comprising:
a flexible display substrate comprising a first display region and a second display region;
an arithmetic processing unit; and
a housing,
wherein the first display region comprises a first region which is transmission type,
wherein the second display region is a non-transmission-type display region,
wherein the arithmetic processing unit is configured to supply an image signal to the flexible display substrate, and
wherein the arithmetic processing unit is stored in the housing.

2. The electronic device according to claim 1,
wherein the arithmetic processing unit and the first display region do not overlap with each other and a background behind the first display region is visible when display is performed in the flexible display substrate.

3. The electronic device according to claim 1,
wherein the second display region is fixed to the housing.

4. The electronic device according to claim 1,
wherein the second display region and the arithmetic processing unit are fixed to overlap.

5. The electronic device according to claim 1,
wherein part of the housing is transparent.

6. The electronic device according to claim 1,
wherein the first display region and the second display region are coextensive with each other when the flexible display substrate is bent.

7. An electronic device comprising:
a flexible display substrate comprising a first display region, a second display region and a third display region;
an arithmetic processing unit fixed to the flexible display substrate; and
a housing,
wherein the second display region is provided between the first display region and the third display region, wherein the third display region is provided between the second display region and the arithmetic processing unit, wherein a part of the flexible display substrate is fixed to the housing, wherein the second display region comprises a first region which is transmission-type, wherein the first display region is a non-transmission-type display region, wherein the third display region is a non-transmission-type display region, and wherein the arithmetic processing unit is configured to supply an image signal to the flexible display substrate.

8. The electronic device according to claim 7, wherein the arithmetic processing unit and the second display region do not overlap with each other and a background behind the second display region is visible when display is performed in the flexible display substrate when the third display region is not bent, and wherein the arithmetic processing unit and the second display region do not overlap with each other and the background behind the second display region is visible when display is performed in the flexible display substrate when the third display region is bent.

9. The electronic device according to claim 7,
wherein the second display region is fixed to the housing.

* * * * *